(12) United States Patent
Kim et al.

(10) Patent No.: US 8,466,623 B2
(45) Date of Patent: Jun. 18, 2013

(54) IMPEDANCE MATCHING METHODS AND SYSTEMS PERFORMING THE SAME

(75) Inventors: Jae-Hyun Kim, Daejeon (KR); Sang-Won Lee, Daejeon (KR); Yong-Gwan Lee, Daejeon (KR)

(73) Assignee: Plasmart, Inc., Daejeon (KR)

( * ) Notice: Subject to any disclaimer, the term of this patent is extended or adjusted under 35 U.S.C. 154(b) by 0 days.

(21) Appl. No.: 13/243,398

(22) Filed: Sep. 23, 2011

(65) Prior Publication Data

US 2012/0013416 A1  Jan. 19, 2012

Related U.S. Application Data

(63) Continuation of application No. 12/072,991, filed on Feb. 29, 2008, now Pat. No. 8,053,991.

(30) Foreign Application Priority Data

Apr. 19, 2007  (KR) .................. 10-2007-0038209

(51) Int. Cl.
  *H01J 7/24* (2006.01)
  *H03H 7/38* (2006.01)
(52) U.S. Cl.
  USPC ..................... 315/111.21; 333/17.3
(58) Field of Classification Search
  USPC .............. 315/3.5, 5.35, 39.3, 111.21, 111.31, 315/111.41; 156/345, 626; 333/17.3, 32, 333/99 PL
  See application file for complete search history.

(56) References Cited

U.S. PATENT DOCUMENTS

| | | | |
|---|---|---|---|
| 3,569,777 | A | 3/1971 | Beaudry |
| 4,112,395 | A | 9/1978 | Seward |
| 4,557,819 | A | 12/1985 | Meacham et al. |
| 5,187,454 | A | 2/1993 | Collins et al. |
| 5,576,629 | A | 11/1996 | Turner et al. |
| 5,585,766 | A | 12/1996 | Shel |
| 5,621,331 | A | 4/1997 | Smith et al. |
| 5,643,364 | A | 7/1997 | Zhao et al. |
| 5,689,215 | A * | 11/1997 | Richardson et al. ......... 333/17.3 |
| 6,259,334 | B1 * | 7/2001 | Howald ...................... 333/17.3 |
| 6,392,408 | B1 * | 5/2002 | Barrall et al. ................ 324/300 |

(Continued)

FOREIGN PATENT DOCUMENTS

| | | |
|---|---|---|
| EP | 0 058 820 A1 | 9/1982 |
| JP | 2005-158684 | 6/2005 |

(Continued)

OTHER PUBLICATIONS

Pozar, David M., Microwave Engineering. John Wiley & Sons Inc: New Jersey, 2005. (pp. 281-328).

(Continued)

*Primary Examiner* — Jimmy Vu

(74) *Attorney, Agent, or Firm* — Jenkins, Wilson, Taylor & Hunt, P.A.

(57) ABSTRACT

Provided are an impedance matching method and a matching system performing the same. The method includes: measuring an electrical characteristic of the power transmission line including the matching system and the load; extracting a control parameter for impedance matching from the electrical characteristic of the power transmission line; and controlling the matching system by using the control parameter. The extracting of the control parameter comprises utilizing an analytic coordinate system that quantitatively relates the electrical characteristic of the matching system to the electrical characteristic of the power transmission line.

29 Claims, 20 Drawing Sheets

U.S. PATENT DOCUMENTS

| | | | |
|---|---|---|---|
| 6,535,785 B2 * | 3/2003 | Johnson et al. | 700/121 |
| 6,838,832 B1 | 1/2005 | Howald et al. | |
| 7,202,734 B1 | 4/2007 | Raab | |
| 7,557,591 B2 | 7/2009 | Donohue | |
| 7,831,226 B2 | 11/2010 | Kwon et al. | |
| 8,053,991 B2 * | 11/2011 | Kim et al. | 315/111.21 |
| 8,120,259 B2 * | 2/2012 | Kim et al. | 315/111.21 |
| 2009/0210181 A1 | 8/2009 | Swank | |

FOREIGN PATENT DOCUMENTS

| | | |
|---|---|---|
| JP | 2005-286853 | 10/2005 |
| KR | 10-2000-0016599 | 3/2000 |
| KR | 10 2006 0001944 | 1/2006 |
| KR | 10-2006-0052418 | 5/2006 |
| WO | WO 97/24748 | 7/1997 |
| WO | 2006/054245 A1 | 5/2006 |
| WO | 2006/054246 A1 | 5/2006 |

OTHER PUBLICATIONS

Extended European Search Report dated May 8, 2009 for European Patent Application No. EP 08019721.3.

Non-Final Office Action for U.S. Appl. No. 12/072,991 dated Dec. 20, 2010.

Notice of Allowance for U.S. Appl. No. 12/072,991 dated Apr. 1, 2011.

Non-final Office Action for U.S. Appl. No. 12/270,431 dated Jun. 2, 2011.

Supplemental Notice of Allowance for U.S. Appl. No. 12/072,991 dated Jul. 22, 2011.

Notice of Allowance for U.S. Appl. No. 12/270,431 dated Oct. 13, 2011.

\* cited by examiner (a)  (b)  (c)

(a)  (b)  (c)

IMPEDANCE MATCHING METHODS AND SYSTEMS PERFORMING THE SAME

CROSS-REFERENCE TO RELATED APPLICATIONS

This application is a continuation of and claims priority to U.S. patent application Ser. No. 12/072,991 filed Feb. 29, 2008, now U.S. Pat. No. 8,053,991 which claims priority under 35 U.S.C. §119 of Korean Patent Application No. 10-2007-0038209, filed on Apr. 19, 2007, the entire contents of which are hereby incorporated by reference.

BACKGROUND OF THE INVENTION

The present invention disclosed herein relates to an impedance matching, and more particularly, to an impedance matching method used in an electric system, such as a plasma system, a nuclear magnetic resonance system, a communication system, a high frequency induction heating device, and a power transmission line and a system performing the same.

If impedance is mismatched between a power source and a load, supplied power to the load cannot be maximized, and moreover controlling of the supplied power is not precisely carried out. Accordingly, an electric system, such as a plasma system, a nuclear magnetic resonance system, a communication system, a high frequency induction heating device, and a power transmission line, includes an impedance matching network between a power source and a load, in order to overcome the above mismatching impedance. For example, a plasma chamber system for fabricating a semiconductor device includes an RF electrode connected to an RF power source and an impedance matching network between the RF power source and the RF electrode. General contents for impedance matching are disclosed in "Microwave Engineering" (Addison-Wesley publisher) in pp. 281-328 written by David M. Pozar, and also techniques relating to impedance matching of a plasma system are disclosed in U.S. Pat. No. 3,569,777, U.S. Pat. No. 4,112,395, U.S. Pat. No. 4,557,819, U.S. Pat. No. 5,187,454, U.S. Pat. No. 5,585,585,766, U.S. Pat. No. 5,621,331, and U.S. Pat. No. 5,689,215, and International Publication No. WO97247748.

FIG. 1 is a flowchart for illustrating a typical impedance matching method.

Referring to FIG. 1, the typical impedance matching method measures electrical characteristics (e.g., current, voltage, and phase) in operation S1, control parameters are extracted from the measured electrical characteristics of a power transmission line to control a matching network in operation S2, and then the matching network is controlled through the extracted control parameters in operation S3.

According to typical methods, a matching network generally includes a plurality of variable capacitors of which capacitances can be controlled through operations of control motors. The extracting of the control parameter in operation S2 includes extracting information for an impedance magnitude and a phase of the power transmission line from a measured current, voltage, and phase difference of the power transmission line, and then by means of the information, capacitances of the variable capacitors required for impedance matching can be calculated.

However, the typical methods cause various technical limitations as follows:

(1) convergence failure for a matching state according to brute dependency on an initial state;

(2) matching delay according to instability near a matching position; and (3) haunting issue according to high dependency on a load and power transmission line impedance.

That is, the above mentioned limitations may not be overcome by a typical matching method because a capacitance magnitude required for matching is determined based on an un-normalized impedance magnitude. This will be described later in more detail.

FIGS. 2 and 3 are diagrams of brute dependency on an initial state in typical impedance matching.

As described above, a typical impedance matching method includes calculating required capacitances based on a magnitude and a phase of measured impedance. At this point, FIGS. 2 and 3 are diagrams for illustrating a mapping method in a capacitance space used for calculation according to a typical matching method. More specifically, FIGS. 2 and 3 are diagrams for illustrating an impedance magnitude and an impedance phase in a power transmission line, respectively, in a capacitance space expressed by coordinates $C_1$ and $C_2$. At this point, FIGS. 2 and 3 illustrate simulation results when an impedance of a load is 5+50j. $C_1$ and $C_2$ represent capacitances of the variable capacitors, respectively.

On the other hand, the solid line of FIG. 2 represents a contour line that connects points of 50 ohm impedance required for matching, and the solid line of FIG. 3 represents a contour line that connects points of a 0° phase required for matching. Accordingly, point corresponding to matching state is point where the solid lines of FIGS. 2 and 3 intersect, and the matching point is illustrated as a small rectangle in FIGS. 2 and 3. On the other hand, a position corresponding to an asterisk represents an initial state.

According to a typical matching method, variations (i.e., $\Delta C_1$ and $\Delta C_2$) of the variable capacitors are respectively determined by the magnitude and phase of the measured impedance. That is, as illustrated in FIG. 2, when the measured impedance is more than 50 ohm expressed by an arrow A1, a corresponding motor is driven to increase $C_1$, and when the measured impedance is less than 50 ohm expressed by an arrow A2 or an arrow A3, a corresponding motor is driven to decrease $C_1$. According to this matching method, points corresponding to arrows A1 and A2 approach the matching state, a point corresponding to arrow A3 is father away from the matching state. That is, according to the typical matching method, matching convergence is dependent on an initial position of a capacitance space because there may be a region (e.g., FR) not converged into a matching state. A diverging issue of matching may identically occur in an impedance phase. Especially, as illustrated in FIG. 2, the matching failure region FR may become excessively broader in a typical method.

Additionally, there are two points of 50 ohm impedance magnitude required for matching with respect to one coordinate $C_1$ in a region $R_1$ of FIG. 2. Like this, when a capacitance space is used, the coordinate $C_1$ may not be to a point of 50 ohm impedance magnitude require for matching in one-to-one correspondence. Therefore, there may be ambiguity in determining a direction of a matching trajectory. This ambiguity may be another reason causing the divergence of matching.

FIG. 4 is a diagram for illustrating instability around a matching point according to typical impedance matching.

Referring to FIG. 4, as a matching trajectory approaches toward a matching state, variations of variable capacitors required for impedance matching are delicately controlled. However, because the typical matching method determines the direction and speed of a matching trajectory based on un-normalized magnitude and phase of impedance, it is difficult to precisely control $C_1$ and $C_2$ around the matching point. As a result, according to the typical matching method, as illustrated in FIG. 4, a spiral matching trajectory may occur, which delays a time for reaching impedance matching. If a gradient of impedance in a capacitance space, which will be described below, is large, the time delay for impedance matching is greatly increased.

FIG. 5 is a diagram for illustrating high dependency on load impedance in typical impedance matching. In more detail, FIG. 5 illustrates a simulation result for a magnitude of impedance when impedance of a load is 1+50j.

Comparing FIG. 5 having a load impedance of 1+50j with FIG. 2 having a load impedance of 5+50j, as a real part in the load impedance is decreased, a matching contour line (a contour line of 50 ohm impedance magnitude required for matching) is shrunken to a narrow region of a capacitance space, and an gradient of a impedance magnitude is drastically increased around the matching contour line. This increase of the gradient value makes a precise capacitance control around the matching point more difficult. Consequently, as illustrated in FIG. 6, a matching trajectory may abnormally move around the matching point (i.e., the haunting issue).

SUMMARY OF THE INVENTION

The present invention provides an impedance matching method capable of reducing dependency on an initial state.

The present invention also provides an impedance matching method having improved matching convergence.

The present invention also provides an impedance matching method providing improved matching characteristics around a matching point.

The present invention also provides an impedance matching method having less dependency on an impedance of a load or a transmission line.

The present invention also provides an impedance matching method providing fast and accurate matching characteristics.

The present invention also provides an impedance matching system capable of reducing dependency on an initial state.

The present invention also provides an impedance matching system having improved matching convergence.

The present invention also provides an impedance matching system providing improved matching characteristics around a matching point.

The present invention also provides an impedance matching system having less dependency on an impedance of a load or a transmission line.

The present invention also provides an impedance matching system providing fast and accurate matching characteristics.

Embodiments of the present invention provide matching methods of an electric device including a load, a power transmission line, and a matching system including: measuring an electrical characteristic of the power transmission line including the matching system and the load; extracting a control parameter for impedance matching from the electrical characteristic of the power transmission line; and controlling the matching system by using the control parameter. The extracting of the control parameter includes utilizing an analytic coordinate system that quantitatively relates the electrical characteristic of the matching system to the electrical characteristic of the power transmission line.

In some embodiments, the analytic coordinate system is selected to injectively map a quantitative relationship between the electrical characteristic of the matching system and the electrical characteristic of the power transmission line.

In other embodiments, coordinates of the analytic coordinate system are selected from physical quantities related to the electrical characteristic of the matching system, and the extracting of the control parameter includes obtaining a displacement vector required for matching of the matching system by analyzing a position and a magnitude of a point corresponding to the measured electrical characteristic of the power transmission line in the analytic coordinate system.

In still other embodiments, the matching system includes at least two variable reactive elements providing variable reactance, and coordinates of the analytic coordinate system are physical quantities obtained by converting the electrical characteristic of the variable reactive elements through a predetermined conversion matrix T.

In even other embodiments, the conversion matrix and the coordinates of the analytic coordinate system are selected according to a type of the matching system, and the conversion matrix is prepared using at least one of an empirical data analysis, a theoretical approach analysis, and a computer simulation analysis.

In yet other embodiments, the matching system is one of an L-type, an inverted L-type, a T-type, and a π type. If the matching system is the L-type including variable capacitors, the coordinates of the analytic coordinate system are selected by a physical quantity that is proportional to an inverse number of a capacitance of each of the variable capacitors, and if the matching system is the inverted L-type including variable capacitors, the coordinates of the analytic coordinate system are selected by a physical quantity that is proportional to a capacitance of each of the variable capacitors, if the matching system is the π type including variable capacitors, the coordinates of the analytic coordinate system are selected by a physical quantity that is proportional to a capacitance of each of the variable capacitors, and if the matching system is the T type including variable capacitors, the coordinates of the analytic coordinate system are selected by a physical quantity that is proportional to an inverse number of a capacitance of each of the variable capacitors.

In further embodiments, the conversion matrix is an n×m ($n \geq 2$ and $m \geq 2$), and n and m are selected according to the number of the coordinates and the number of the variable reactive elements.

In still further embodiments, elements of the conversion matrix are selected from values between −1 and 1.

In even further embodiments, the measuring of the electrical characteristic of the power transmission line includes measuring a voltage magnitude, a current magnitude, and a phase difference therebetween of the power transmission line.

In yet further embodiments, the extracting of the control parameter includes: converting the electrical characteristic of the power transmission line into a characteristic vector with a normalized magnitude; obtaining a displacement vector required for matching of the matching system by analyzing the characteristic vector in the analytic coordinate system; and converting the displacement vector into a control parameter for a control of the matching system.

In yet further embodiments, the converting of the electrical characteristic of the power transmission line into the characteristic vector includes: calculating an input impedance of the power transmission line from the electrical characteristic of the power transmission line; calculating a reflection coefficient of the power transmission line from the input impedance; and calculating a characteristic vector from the reflection coefficient, the characteristic vector expressing the electrical characteristic of the power transmission line. The characteristic vector includes at least two independent physical quantities related to the electrical characteristic of the power transmission line as its elements.

In yet further embodiments, the characteristic vector is a second dimensional vector including a real part and an imaginary part of the reflection coefficient as its elements.

In yet further embodiments, the displacement vector includes information for a direction and a distance of coordinate movement in the analytic coordinate system, the information being required for matching of the matching system.

In yet further embodiments, the matching system includes at least first and second variable reactive elements, the analytic coordinate system is a two dimensional coordinate system having G1 and G2 as coordinates, G1 and G2 are physical quantities obtained by converting the respective electrical characteristics of the first and second variable reactive elements through a predetermined conversion matrix T, and the characteristic vector is a two dimensional vector including a real part and an imaginary part of the reflection coefficient of the power transmission line as its elements. The obtaining of the displacement vector includes obtaining differentiation of G1 and G2.

In yet further embodiments, if the matching system is an L-type or a π type, differentiation of the coordinate G1 is a negative number of the imaginary part of the reflection coefficient and differentiation of the coordinate G2 is a real number of the real part of the reflection coefficient, and if the matching system is an inverted L-type or an T-type, differentiation of the coordinate G1 is a negative number of the imaginary part of the reflection coefficient and differentiation of the coordinate G2 is a negative number of the real part of the reflection coefficient.

In yet further embodiments, the matching system is one of an L-type, an inverted L-type, a T-type, and a π type, the conversion matrix and coordinates of the analytic coordinate system are selected according to a type of the matching system, and the conversion matrix is prepared using at least one of an empirical data analysis, a theoretical approach analysis, and a computer simulation analysis.

In yet further embodiments, the matching system is an L-type including variable capacitors, the coordinates G1 and G2 are selected by a physical quantity that is proportional to an inverse number of a capacitance of each of the variable capacitors, and if the matching system is an inverted L-type including variable capacitors, the coordinates G1 and G2 are selected by a physical quantity that is proportional to a capacitance of each of the variable capacitors, the matching system is an π type including variable capacitors, the coordinates G1 and G2 are selected by a physical quantity that is proportional to an inverse number of a capacitance of each of the variable capacitors, and if the matching system is an inverted T-type including variable capacitors, the coordinates G1 and G2 are selected by a physical quantity that is proportional to a capacitance of each of the variable capacitors.

In yet further embodiments, the conversion matrix is a 2 by 2 matrix, and elements of the conversion matrix are selected from values between −1 and 1.

In yet further embodiments, the converting of the displacement vector in to the control parameter includes: converting the displacement vector in the analytic coordinate system into a reduced device vector of electrical characteristics of elements constituting the matching system; calculating a driving vector by using the reduced device vector; and converting the driving vector into the control parameter.

In yet further embodiments, the calculating of the driving vector includes multiplying the reduced device vector by a standard gain and a first gain factor, the first gain factor being defined to have a larger value as a magnitude of the characteristic vector increases.

In yet further embodiments, the calculating of the driving vector further includes multiplying a second gain factor by the reduced device vector, the second gain factor providing a change of a matching trajectory.

In yet further embodiments, the second gain factor is 1 when the matching trajectory is within an allowable characteristic range of the matching system, and is −1 when the matching trajectory is out of the allowable characteristic range of the matching system.

In yet further embodiments, the matching system includes first and second variable reactive elements having reactance controlled by operations of first and second control motors, and the converting of the driving vector into the control parameter includes converting the driving vector into at least two control parameters in order to numerically control operations of the first and second control motors.

In yet further embodiments, the control parameters are operational speeds of the first and second control motors, the operational speeds being obtained by a product of the driving vector and a gain factor.

In yet further embodiments, the converting of the electrical characteristic of the power transmission line into the characteristic vector further includes rotating the characteristic vector by using a rotation matrix having a predetermined angle parameter θ, the predetermined angle parameter θ of the rotation matrix having a one value selected between −90° and 90°.

In yet further embodiments, before the extracting of the control parameter, the matching methods further include performing a matching state test that determines whether or not the matching system is within an allowable matching state.

In yet further embodiments, the performing of the matching state test includes: calculating a state parameter from the electrical characteristic of the power transmission line; evaluating whether the state parameter is within an allowable range or not; and measuring again the electrical characteristic of the power transmission line if the state parameter is within the allowable range.

In yet further embodiments, the state parameter P is calculated by Equation below.

$$P=(1+S)/(1-S)$$

(at this point, S represents an absolute value of the reflection coefficient of the power transmission line)

In yet further embodiments, if the state parameter P corresponds to one of two conditions below, it is determined that the state parameter P is within the allowable range.

$$P<=P1 \quad (1)$$

$$P1<P<P2 \quad (2)$$

(at this point, P1 represents the minimum allowable value of the state parameter P, and P2 represents the maximum allowable value of the state parameter P).

In yet further embodiments, the matching methods further include changing at least one among the matching parameters between the procedures.

In yet further embodiments, the changing of the matching parameter is selectively performed when the power transmission line has an impedance out of a matching state at the more than critical number of times.

In yet further embodiments, the load is one of a plasma system, a nuclear magnetic resonance system, a communication system, a high frequency induction heating device, and a power transmission line.

In other embodiments of the present invention, matching methods of an electric device including a load, a power transmission line, and a matching system including: measuring an electrical characteristic of the power transmission line; extracting a control parameter for impedance matching from the electrical characteristic of the power transmission line; and controlling the matching system by using the control parameter. The matching system includes at least two variable reactive elements providing variable reactance, and a reactance variation of the variable reactive element depends on a matching degree of the matching system.

In some embodiments, the controlling of the matching system includes using a reflection coefficient as the matching degree of the matching system, the reflection coefficient being calculated from the measured electrical characteristic of the power transmission line.

In other embodiments, the controlling of the matching system includes increasing the reactance variation of the variable reactive element as the reflection coefficient of the power transmission line increases.

In still other embodiments, the controlling of the matching system includes increasing the reactance variation of the variable reactive element as the reflection coefficient of the power transmission line increases.

In even other embodiments, the variable reactive element includes: at least one variable electrode providing a reactance change of the variable reactive element; and a driving device connected to the variable electrode to change a position of the variable electrode. The controlling of the matching system includes changing the position of the variable electrode by driving the driving device.

In yet other embodiments, the controlling of the matching system includes increasing variation of the position of the variable electrode as a reflection coefficient of the power transmission line increases, the reflection coefficient being calculated from the measured electrical characteristic of the power transmission line.

In further embodiments, the extracting of the control parameter includes: calculating an input impedance of the power transmission line from the electrical characteristic of the power transmission line; and calculating a reflection coefficient of the power transmission line from the input impedance. The matching system includes at least two variable reactive elements, and during the controlling of the matching system, a reactance variation of the first variable reactive element is proportional to a magnitude of an imaginary part in the reflection coefficient, and a reactance variation of the second variable reactive element is proportional to a magnitude of a real part in the reflection coefficient.

In still further embodiments, the extracting of the control parameter includes utilizing an analytic coordinate system that quantitatively relates the electrical characteristic of the matching system to the electrical characteristic of the power transmission line.

In even further embodiments, the analytic coordinate system is selected to injectively map a quantitative relationship between the electrical characteristic of the matching system and the electrical characteristic of the power transmission line.

In yet further embodiments, the extracting of the control parameter includes obtaining a displacement vector required for matching of the matching system by analyzing a position and a magnitude of a point corresponding to the measured electrical characteristic of the power transmission line in the analytic coordinate system.

In yet further embodiments, the extracting of the control parameter includes: calculating an input impedance of the power transmission line from the electrical characteristic of the power transmission line including the matching system and the load; calculating a reflection coefficient of the power transmission line from the input impedance; and obtaining a gain factor from the reflection coefficient of the power transmission line. A reactance variation of the variable reactive element is proportional to a product of the gain factor and the matching degree of the matching system.

In yet further embodiments, the obtaining of the gain factor includes multiplying a predetermined standard gain by a first gain factor, the first gain factor having a larger value as the reflection coefficient of the power transmission line increases.

In yet further embodiments, the obtaining of the gain factor includes multiplying a predetermined standard gain, a first gain factor, and a second gain factor, the first gain factor having a larger value as the reflection coefficient of the power transmission line increases, the second gain factor having 1 if a reactance variation of the variable reactive element is within an allowable characteristic range of the matching system, and having −1 if not.

In yet further embodiments, the matching methods further include performing a matching state test that confirms whether the matching system is within an allowable matching state or not before the extracting of the control parameter.

In yet further embodiments, the performing of the matching state test includes: calculating a state parameter from the electrical characteristic of the power transmission line; evaluating whether the state parameter is within an allowable range or not; and measuring again the electrical characteristic of the power transmission line if the state parameter is within the allowable range.

In yet further embodiments, the matching methods further include repeating a series of procedures that include the measuring of the electrical characteristic, the extracting of the control parameter, and the controlling of the matching system. The procedures are performed based on predetermined matching parameters for an extraction of the control parameter and a control of the matching system.

In yet further embodiments, the matching method further include changing the matching parameter between the procedures. The changing of the matching parameter is selectively performed if the matching system does not reach a matching state at the more than critical number of times.

In yet further embodiments, the load is one of a plasma system, a nuclear magnetic resonance system, a communication system, a high frequency induction heating device, and a power transmission line.

In still other embodiments of the present invention, matching methods of an electric device including a load, a power transmission line, and a matching system include: measuring an electrical characteristic of the power transmission line including the matching system and the load; converting the electrical characteristic of the power transmission line into a characteristic vector; obtaining a displacement vector required for matching of the matching system by analyzing a magnitude of the characteristic vector in an analytic coordinate system; converting the displacement vector into a control parameter for a control of the matching system; and controlling the matching system by using the control parameter. The analytic coordinate system is selected to injectively map a quantitative relationship between the electrical characteristic of the matching system and an electrical characteristic of the power transmission line, and the characteristic vector is converted to have a normalized magnitude.

In some embodiments, coordinates of the analytic coordinate system are selected from physical quantities related to the electrical characteristic of the matching system, and the extracting of the control parameter includes obtaining a displacement vector required for matching of the matching system by analyzing a position and a magnitude of a point corresponding to the measured electrical characteristic of the power transmission line in the analytic coordinate system.

In other embodiments, the matching system includes at least two variable reactive elements providing variable reactance, coordinates of the analytic coordinate system are physical quantities obtained by converting the electrical characteristic of the variable reactive elements through a predetermined conversion matrix T, the conversion matrix and the coordinates of the analytic coordinate system are selected according to a type of the matching system, and the conversion matrix is prepared using at least one of an empirical data analysis, a theoretical approach analysis, and a computer simulation analysis.

In still other embodiments, the matching system is one of an L-type, an inverted L-type, a T-type, and a π type. If the matching system is the L-type including variable capacitors, the coordinates of the analytic coordinate system are selected by a physical quantity that is proportional to an inverse number of a capacitance of each of the variable capacitors, and if the matching system is the inverted L-type including variable capacitors, the coordinates of the analytic coordinate system are selected by a physical quantity that is proportional to a capacitance of each of the variable capacitors.

In even other embodiments, the converting of the electrical characteristic of the power transmission line into the characteristic vector includes: calculating input impedance of the power transmission line from the electrical characteristic of the power transmission line; calculating a reflection coefficient of the power transmission line from the input impedance; and calculating a characteristic vector from the reflection coefficient, the characteristic vector expressing the electrical characteristic of the power transmission line. The characteristic vector is a second dimensional vector including a real part and an imaginary part of the reflection coefficient as its elements.

In yet other embodiments, the load is one of a plasma system, a nuclear magnetic resonance system, a communication system, a high frequency induction heating device, and a power transmission line.

In even other embodiments of the present invention, matching methods of an electric device including a load, a power transmission line, and a matching system include: measuring an electrical characteristic of the power transmission line including the matching system and the load; extracting a control parameter from the electrical characteristic of the power transmission line; and controlling the matching system by using the control parameter. The matching system includes at least two variable reactive elements providing variable reactance, the extracting of the control parameter includes calculating an imaginary part and a real part of the reflection coefficient of the power transmission line, and the controlling of the matching system includes respectively controlling variations of reactance of the first and second variable reactive elements by using magnitudes of the imaginary part and the real part of the reflection coefficient.

In some embodiments, the controlling of the matching system includes controlling the first and second variable reactive elements in order to allow reactance of the first and second variable reactive elements to have variations, the variations being proportional to values obtained by multiplying a gain factor and the respective imaginary part and the real part of the reflection coefficient.

In other embodiments, the load is one of a plasma system, a nuclear magnetic resonance system, a communication system, a high frequency induction heating device, and a power transmission line.

In yet other embodiments of the present invention, matching systems perform the above first matching method.

In further embodiments of the present invention, matching systems perform the above second matching method.

In still further embodiments of the present invention, matching systems perform the above third matching method.

In even further embodiments of the present invention, matching, systems perform the above fourth matching method.

In yet further embodiments of the present invention, matching systems include: a characteristic vector extractor expressing a measured electrical characteristic of a power transmission line as a characteristic vector having at least two normalized physical quantities; a reduced device vector extractor extracting a reduced device vector from the characteristic vector, the reduced device vector expressing a reactance variation required for impedance matching; and a driving vector extractor extracting a driving vector for driving a variable reactive element from the reduced device vector.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 7:
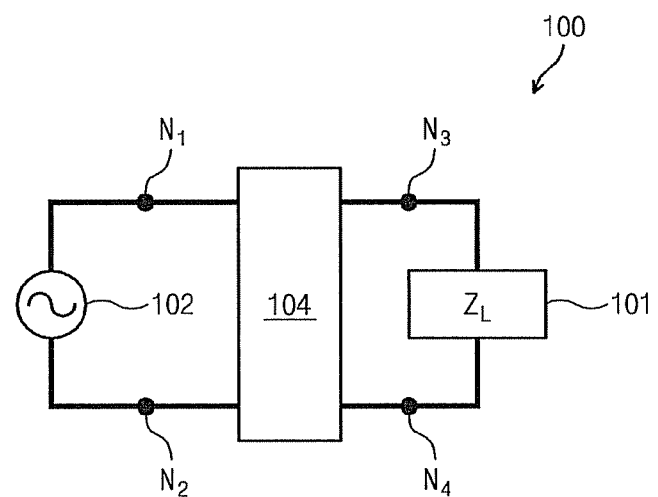
FIG. 7 is a circuit diagram of an electric device including a matching system according to one embodiment of the present invention.

FIG. 7 is a circuit diagram of an electric device including a matching system according to one embodiment of the present invention.

Referring to FIG. 7, an electric device 100 according to the present invention includes a power source 102, a load 101, a power transmission line 103 between the power source 102 and the load 101, and a matching system 104. The power source 102 is connected to input terminals $N_1$ and $N_2$ on the power transmission line 103, and the load 101 is connected to load terminals $N_3$ and $N_4$ on the power transmission line 103. An input impedance to be described later means an impedance of a system including the matching system 104 and the load 101, which is measured at the input terminal $N_1$. At this point, the load 101 may be one a plasma system, a nuclear magnetic resonance system, a communication system, a high frequency induction heating device, and a power transmission line.

The matching system 104 includes at least one variable reactive element that variably controls its reactance. According to one embodiment of the present invention, the matching system 104 further includes passive elements providing a fixed reactance besides the variable reactive element. On the other hand, the matching system 104 is configured to resolve typical limitations such as brute dependency on an initial state, instability around a matching point, and high dependency on a load and transmission impedance. These technical effects can be accomplished through impedance matching methods according to the present invention that will be described in more detail later. The matching system 104 further includes a processing unit 200 of FIG. 27 performing operations of an impedance matching method according to the present invention. The processing unit 200 will be described in more detail with reference to FIG. 27.

According to the present invention, a variable reactive element may be one of a variable capacitor providing a variable capacitance, a variable inductor providing a variable inductance, and a variable resistance providing a variable resistance. Below, for concise description, technical features of the present invention will be described based on embodiments using a variable capacitor as a variable reactive element. However, it is apparent to those skilled in the art that technical features of the present invention are easily realized without unnecessary efforts in embodiments including different kinds of variable reactive elements, according to a well-known electromagnetic theory. Furthermore, for succinct description, technical features of the present invention will be described based on embodiments including two variable reactive elements. However, it is apparent to those skilled in the art that technical features of the present invention are easily realized without unnecessary efforts in embodiments including the more number of variable reactive elements and including the additional passive elements, according to a well-known electromagnetic theory.

[Various Types of Matching Systems]

On the other hand, the matching system 104 may be classified into various types according to methods in which the variable reactive element or the passive elements are connected to the power transmission line 103. For example, according to the above-mentioned premises for concise description, if the matching system 104 includes first and second variable capacitors 111 and 112, it may be classified into an L-type, an inverted L-type, a T-type and a π-type according to the way the first and second variable capacitors 111 and 112 are connected to the power transmission line 103.

FIGS. 8 to 11 are circuit diagrams of various types of the matching system 104.

Figure 8:
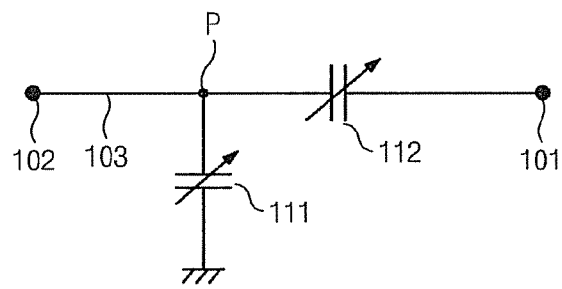
FIGS. 8 to 11 are circuit diagrams of various types of a matching system according to one embodiment of the present invention.
Figure 9:
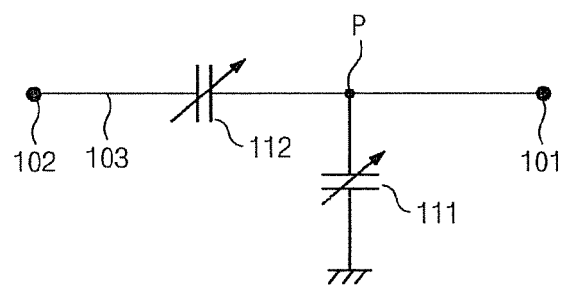

Referring to FIG. 8, according to the L-type matching system, the first variable capacitor 111 is connected to a predetermined point P of the power transmission line 103, and the second variable capacitor 112 is disposed between the load 101 and the point P. Referring to FIG. 9, according to the inverted L-type matching system, the first variable capacitor 111 is connected to a predetermined point P of the power transmission line 103, and the second variable capacitor 112 is disposed between the power source 102 and the predetermined point P.

Figure 10:
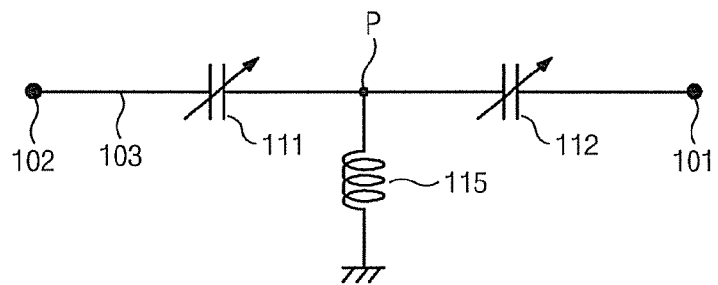
Figure 11:
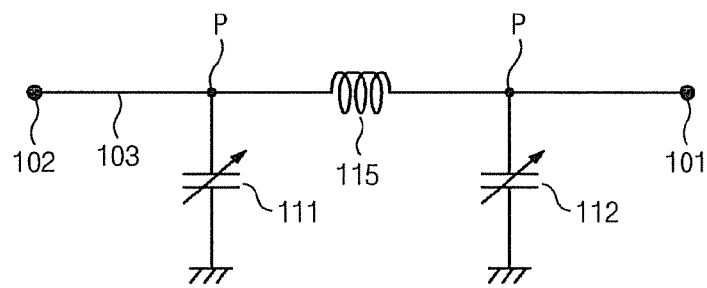

Referring to FIG. 10, according to the T-type matching system, the first and second variable capacitors 111 and 112 connect the power source 102 and the load 101 in series on the power transmission line 103. According to one embodiment of the present invention, a predetermined passive element (e.g., an inductor 115) may be connected to the power transmission line 103 (i.e., the point P) between the first and second variable capacitors 111 and 112. Referring to FIG. 11, according to the n-type matching system, the first and second variable capacitors 111 and 112 are respectively connected to the power transmission line 103 in parallel. According to one embodiment of the present invention, a predetermined passive element (e.g., an inductor 115) may be connected to the power transmission line 103 (i.e., the point P) between the first and second variable capacitors 111 and 112.

Figure 12:
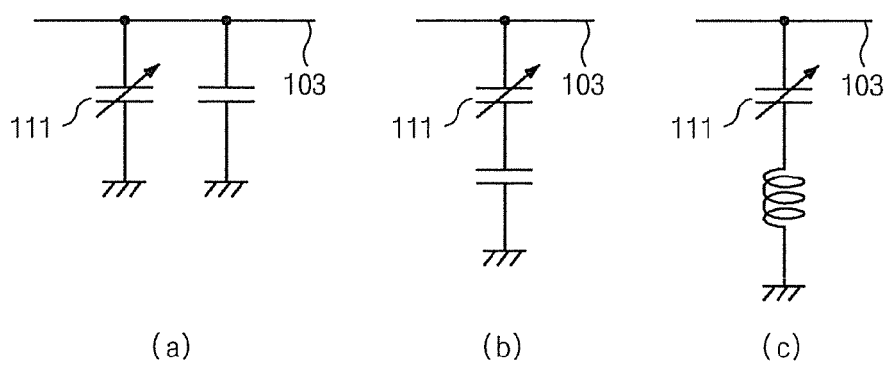
FIGS. 12 to 15 are circuit diagrams of various types of a modified matching system according to one embodiment of the present invention.
Figure 13:
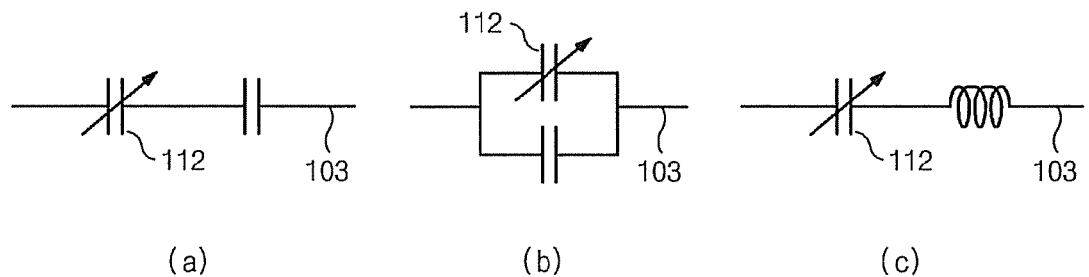
Figure 14:
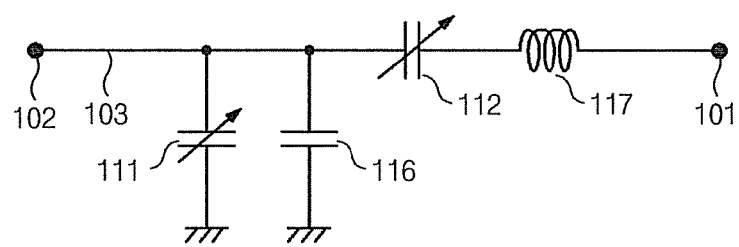
Figure 15:
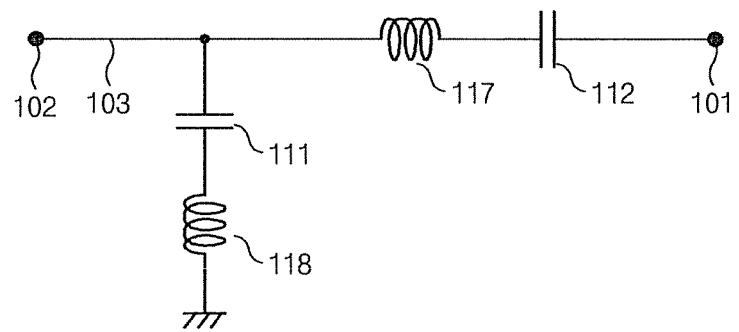

Elements connected to the point P of the power transmission line 103, as illustrated in FIGS. 8 through 12, may be connected to another grounded power transmission line. On the other hand, the matching system of the present invention may have various modified structures. For example, as illustrated in FIGS. 12 through 13, at least one passive element can be further included, which is connected in parallel or series to the power transmission line 103. To be more specific, the matching system of the L-type matching system further includes passive elements (i.e., a capacitor 116) or inductors (117 and 118), which are additionally provided, as illustrated in FIGS. 14 and 15.

On the other hand, FIGS. 8 through 15 are circuit diagrams of the matching system, and the kinds and number, and positions of the variable reactive elements and passive elements in the matching system 104 may vary according to other embodiments of the present invention.

[Matching Method]

Figure 16:
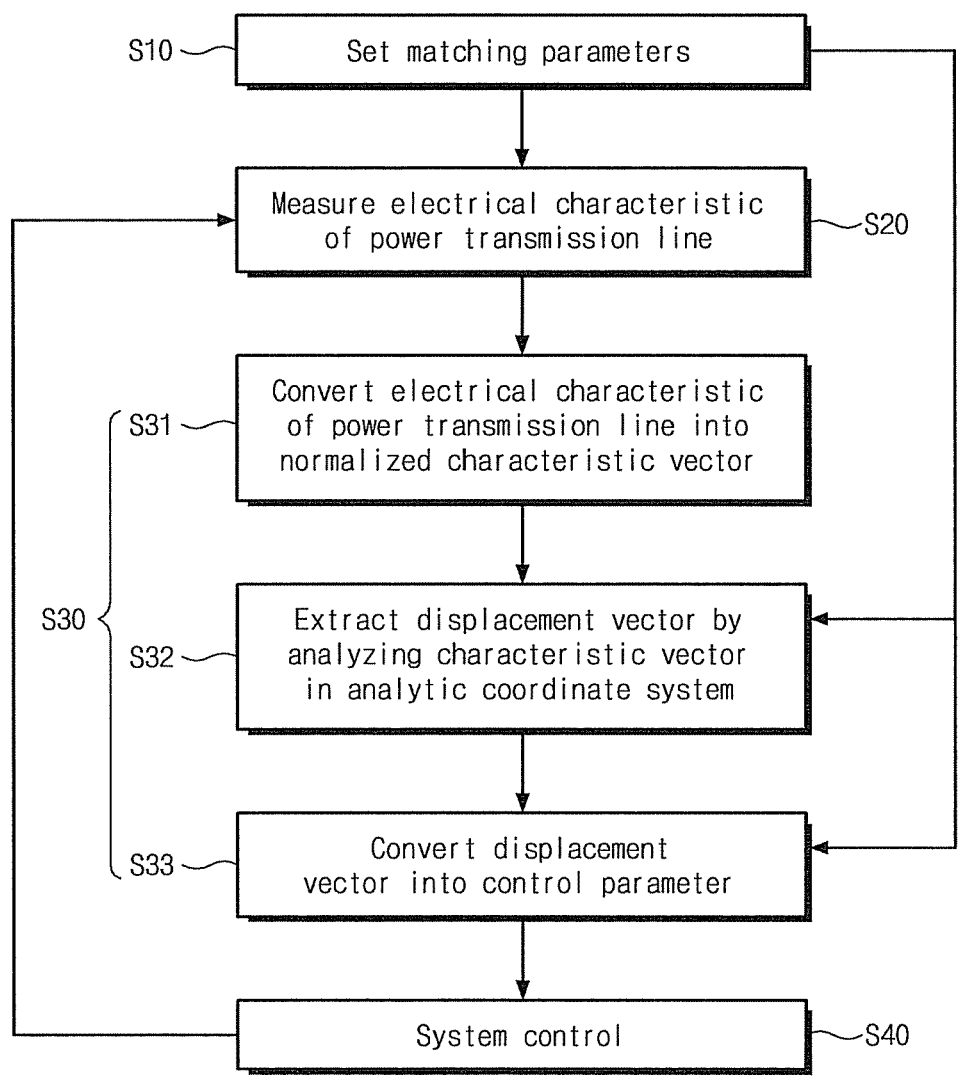
FIG. 16 is a flowchart of an impedance matching method according to one embodiment of the present invention.

FIG. 16 is a flowchart of an impedance matching method according to one embodiment of the present invention.

Referring to FIG. 16, the impedance matching method includes measuring electrical characteristics of a power transmission line in operation S20, extracting control parameters from the measured electrical characteristics of the power transmission line for impedance matching in operation S30, and then controlling the matching system by using extracted control parameters in operation S40.

According to the present invention, the electrical characteristics may include a current, a voltage, and a phase difference therebetween of the power transmission line, and their physical quantities can be measured periodically or in real time through a predetermined sensor. The phase difference can be calculated by analyzing a measurement result of the current and voltage of the power transmission line.

On the other hand, before the measuring of the electrical characteristics, predetermined matching parameters can be set in operation S10. The matching parameters are various parameters used in an impedance matching process of the present invention, and may include physical/electrical parameters related to the corresponding electric device, parameters for the measuring of the electrical characteristics in operation S20, parameters for the extracting of the control parameters in operation S30, and parameters for controlling of the system in operation S40. Additionally, the matching parameters may be set in other operations, and also a part of the matching parameters may be changed if necessary while performing impedance matching, as illustrated below.

According to one embodiment of the present invention, the extracting of the control parameter in operation S30 includes converting the measured electrical characteristic of the power transmission line into a characteristic vector in operation S31, extracting a displacement vector for impedance matching by analyzing the characteristic vector in a predetermined analytic coordinate system in operation S32, and converting the displacement vector into a control parameter for the controlling of the matching system of operation S40 in operation S33.

At this point, the analytic coordinate system is selected to express a predetermined phase space that quantitatively relates the electrical characteristic of the matching system to the electrical characteristic of the power transmission line. That is, a quantitative relationship between the electrical characteristic of the matching system and the electrical characteristic of the power transmission line can be expressed through the analytic coordinate system. The displacement vector includes magnitude of a coordinate change as an element, which is required for moving the characteristic vector toward a point corresponding to a matching state in the analytic coordinate system. The analytic coordinate system and the displacement vector will be described in more detail.

[Selection of Characteristic Vector]

According to the present invention, the characteristic vector is defined based on measured electrical characteristic of the power transmission line, and may be a physical quantity having a normalized magnitude. Like this, because the measured electrical characteristic of the power transmission line is expressed in a normalized physical quantity, the matching method of the present invention can reduce excessive dependency on a gain factor, which will be described layer, and its fine control around the matching point is possible. As a result, the matching method may be contributed to resolve the above-mentioned typical technical limitations. These technical effects will be descried in more detail below.

According to one embodiment of the present invention, the characteristic vector may be defined from a reflection coefficient $S_{11}$ of the power transmission line. As well-known, the reflection coefficient $S_{11}$ of the power transmission line can be defined by characteristic impedance $Z_0$ of the power transmission line and impedance (i.e., input impedance Z) of the input terminal of the power transmission line, as expressed in a following Equation 1.

$$S_{11} = \frac{Z - Z_0}{Z + Z_0} \quad \text{[Equation 1]}$$

Its magnitude (i.e., $S=|S_{11}|$) is a value between 0 and 1. (at this point, the input impedance Z of the power transmission line represents impedance of a system including the matching system and the load, which is measured at the input terminals $N_1$ and $N_2$.)

On the other hand, as described above, the matching system 104 may include at least two variable reactive elements. In this case, to explicitly determine reactance of each variable reactive element, the characteristic vector needs to be a physical quantity including at least two elements. For example the characteristic vector Q can be defined by using a two dimensional vector including a real part $\text{Re}\{S_{11}\}$ and an imaginary part ($\text{Im}\{S_{11}\}$) of the reflection coefficient as its elements, as expressed in Equation 2.

$$Q = \begin{pmatrix} Q_1 \\ Q_2 \end{pmatrix} = \begin{pmatrix} \text{Re}\{S_{11}\} \\ \text{Im}\{S_{11}\} \end{pmatrix} \quad \text{[Equation 2]}$$

[Selection of Analytic Coordinate System]

As described above, the analytic coordinate system is selected to express a predetermined phase space that quantitatively relates the electrical characteristic of the matching system to the electrical characteristic of the power transmission line. For this end, coordinates of the analytic coordinate system are selected from physical quantities related to the electrical characteristics of the power transmission line, and the electrical characteristic of the power transmission line is expressed as one selected point of the analytic coordinate system. According to one embodiment of the present invention, the coordinates (hereinafter, referred to as an analytic coordinates) of the analytic coordinate system can be expressed in a function of an electrical characteristic (e.g., reactance) of variable reactive elements constituting the matching system, and the characteristic vector expressing the measured electrical characteristic of the power transmission line can be expressed as one point of the analytic coordinate system.

On the other hand, the analytic coordinate system may be selected for injectively mapping a quantitative relationship between the electrical characteristic of the matching system and the electrical characteristic of the power transmission line (at this point, the meaning of the "injective mapping" in the present invention will be described in more detail with reference to FIGS. 17 and 18). To make the injective mapping possible, the analytic coordinate system may be a physical quantity that can be obtained by converting the measurable electrical characteristic (e.g., reactance) of the matching system through a predetermined conversion matrix T. For example, an analytic coordinate G can be obtained by an inner product of a predetermined conversion matrix T and a predetermined device vector X as expressed in Equation 3 below.

$$G = TX \quad \text{[Equation 3]}$$

At this point, the conversion matrix T and the device vector X may be selected to satisfy technical requirements for the analytic coordinates related to the injective mapping. This selection is dependable on a type of the matching system. To be more specific, the device vector X includes physical quantities related to respective electrical characteristics of variable reactive elements constituting the matching system as its elements, and can be selected according to a type of the matching system. Consequently, the analytic coordinate G is also selected according to a type of the matching system.

To be more specific, the matching system may include two variable reactive elements. In this case, the analytic coordinates $G_1$ and $G_2$ can be obtained by an inner product of physical quantities $X_1$ and $X_2$ and a 2 by 2 square matrix T as illustrated in Equation 4 below. The physical quantities $X_1$ and $X_2$ are related to the respective electrical characteristics of the variable reactive elements. According to the present invention, elements $a_{11}$, $a_{12}$, $a_{21}$, and $a_{22}$ of the conversion matrix T are selected from values between −1 to 1.

$$\begin{pmatrix} G_1 \\ G_2 \end{pmatrix} = T \begin{pmatrix} X_1 \\ X_2 \end{pmatrix}, \quad T = \begin{pmatrix} a_{11} a_{12} \\ a_{21} a_{22} \end{pmatrix}. \quad \text{[Equation 4]}$$

On the other hand, the conversion matrix T can be prepared through various methods. For example, the conversion matrix T can be obtained using at least one of an empirical data analysis, a theoretical approach analysis, and a computer simulation analysis. These analyses are performed based on a type of the matching system and a physical quantity of the device vector X. Additionally, the form and rank of the conversion matrix T are determined by the number of reactive elements constituting the matching system. That is, if the matching system includes the more number of variable reactive elements, the form and rank of the conversion matrix T may grow.

As described above, the matching system may include two variable capacitors, and may be an L-type or an inverted L-type as described with reference to FIGS. 8 and 9. In this case, the conversion matrix T and the device vector X may be expressed in a function of capacitances of the variable capacitors. That is, in a case of the L-type matching system illustrated in FIG. 8, the device vector X may be given as expressed in Equation 5, and in a case of the inverted L-type matching system, the device vector X may be given as expressed in Equation 6.

$$X_i = \frac{1}{\omega C_i} \quad \text{[Equation 5]}$$

$$X_i = C_i \quad \text{[Equation 6]}$$

Figure 17:
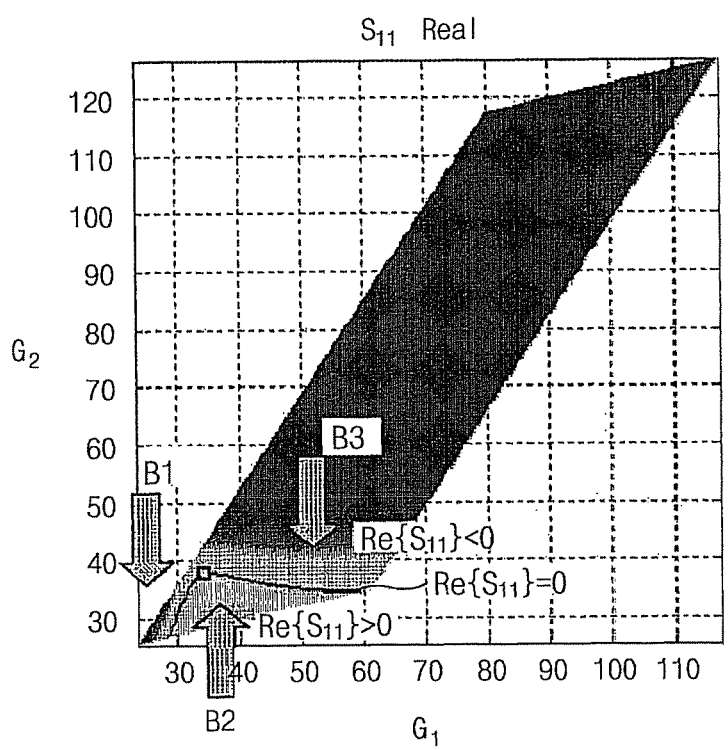
FIGS. 17 and 18 are diagrams of an analytic coordinate system for illustrating displacement vector extraction according to one embodiment of the present invention.
Figure 18:
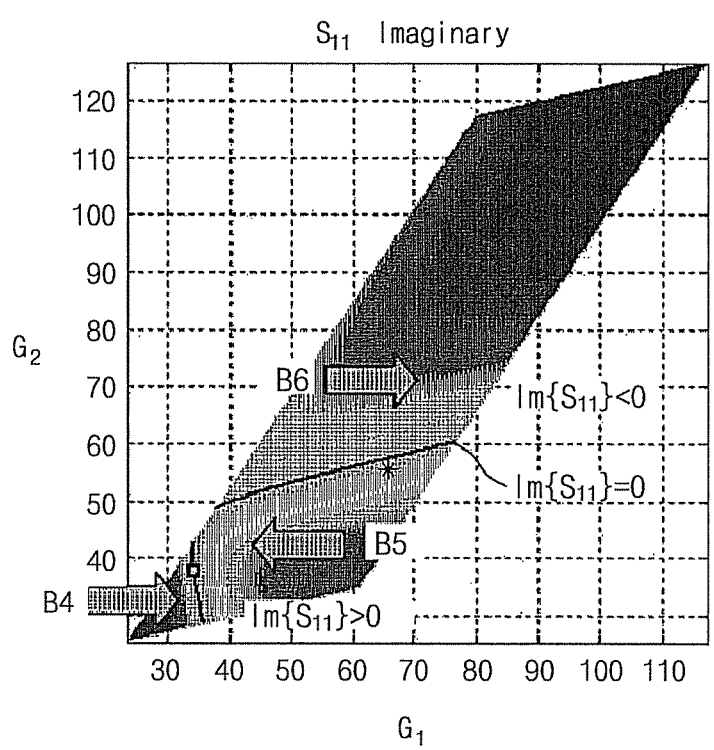

FIGS. 17 and 18 are diagrams of an analytic coordinate system for illustrating displacement vector extraction according to one embodiment of the present invention. To be more specific, this embodiment is related to the L-type matching system including two variable capacitors, and also coordinates of the analytic coordinate system are physical quantities obtained by converting capacitances of the variable capacitors through the above Equations 4 and 5. At this point, elements of the characteristic vector are selected by a real part and an imaginary part of a reflection coefficient of the power transmission line, as expressed in Equation 2.

FIG. 17 illustrates one element (i.e., the real part of the reflection coefficient) of the characteristic vector, which is mapped into the analytic coordinate system. FIG. 18 illustrates one element (i.e., the imaginary part of the reflective part) of the characteristic vector, which is mapped into the analytic coordinate system. Additionally, the respective solid lines of FIGS. 17 and 18 are contour lines (hereinafter, matching lines) showing positions of the characteristic vector that satisfies the requirement of $\text{Re}\{S_{11}\}=0$ and $\text{Im}\{S_{11}\}=0$. In this aspect, a point (hereinafter, referred to as a matching point) corresponding to a matching state is a point where the solid lines of FIGS. 18 and 19 intersect, and this matching point is illustrated in a small rectangle in FIGS. 17 and 18. On the other hand, a point corresponding to an asterisk represents an initial state.

Because the analytic coordinates $G_1$ and $G_2$ are prepared through Equation 4 to satisfy technical requirements for the analytic coordinate system, points on the matching line can be expressed in a function of the analytic coordinate system. That is, referring to FIG. 17, an arbitrary value of a coordinate $G_1$ corresponds to one point of the matching line in a predetermined region. Similarly, referring to FIG. 18, an arbitrary value of a coordinate $G_2$ corresponds to one point of the matching line in a predetermined region. The term "injective mapping" means that one point of the matching line corresponds to one of the analytic coordinates. In this aspect, as illustrated in FIG. 17, the coordinate $G_1$ is injectively mapped into one element (i.e., the real part of the reflection coefficient) of the characteristic vector. Likewise, as illustrated in FIG. 18, the coordinate $G_2$ is injectively mapped into the other element (i.e., the imaginary part of the reflection coefficient) of the characteristic vector.

Through this injective mapping, the matching method of the present invention makes it possible to search an effective matching trajectory in an entire region of the analytic coordinate system. That is, as illustrated in FIGS. 17 and 18, through this injective mapping, the effective matching trajectory can be obtained with respect to all points of the analytic coordinate system, and the matching failure region FR of FIG. 2 according to the typical method is not shown in the analytic coordinate system. That is, ambiguity in determining a direction of the matching trajectory in the typical method does not occur in during a matching trajectory analysis using an analytic coordinate system of the present invention.

[Determination of Displacement Vector]

The determining of the displacement vector in operation S32 includes analyzing a magnitude or a position of the characteristic vector (hereinafter, referred to as a measured characteristic vector) corresponding to a measured state of the power transmission line in the analytic coordinate system. As defined above, the magnitude of the displacement vector expresses the magnitude of coordinate movement required for moving the measured characteristic vector to the matching line in the analytic coordinate system. That is, the length of the displacement vector corresponds to the distance between the position of the measured characteristic vector and the matching point.

However, because only the information (i.e., impedance) for a measured electrical state during an actual matching process is known, it is possible to determine whether a current measured state is matching state or not. However, the position of a matching point cannot be accurately determined. As a result, a direction (i.e., a progression direction of a matching trajectory) of the displacement vector can be determined, but the exact magnitude of the displacement vector may not be determined. Due to these technical limitations, capacitances of the variable capacitors are determined based on the measured magnitude of impedance according to the typical method. However, because the impedance is not a normalized physical quantity, it is difficult to precisely control capacitance variations.

On the other hand, according to one embodiment of present invention, elements of the displacement vector, as expressed in Equation 7, can be defined by the elements of the characteristic vector, and this definition for the displacement vector also can be contributed to resolve the above-mentioned typical technical limitations.

In more detail, referring to FIG. 17 again, the magnitude of each point, expressed through tone of color, represents a value of a real part $Re\{S_{11}\}$ of a reflection coefficient, and the matching line expressed by a solid line represents points that satisfy the requirement of $Re\{S_{11}\}=0$. Additionally, a region (hereinafter, referred to as a first region) below the matching line where an arrow of B2 is disposed represents $Re\{S_{11}\}>0$. Additionally, a region (hereinafter, referred to as a second region) above the matching line where arrows of B1 and B3 are disposed represents $Re\{S_{11}\}<0$. Likewise, referring to FIG. 18, the matching line expressed by the solid line represents points that satisfy the requirement of $Im\{S_{11}\}=0$. Additionally, the right region B5 (hereinafter, referred to as a third region) of the matching line where an arrow B5 is disposed represents a region of $Im\{S_{11}\}>0$, and the left region (hereinafter, referred to as fourth region) of the matching line where arrows B4 and B6 are disposed represents a region of $Im\{S_{11}\}<0$.

Accordingly, to approach the matching point, a value of the coordinate $G_2$ in the first region needs to be increased, and a value of the coordinate $G_2$ in the second region needs to be decreased. Additionally, values of the coordinates in the third region need to be decreased, and values of the coordinates in the fourth region need to be increased. For example, the coordinates values $G_1$ and $G_2$ needs to be reduced, such that an initial state indicated as asterisk can approach the matching point. Accordingly, if variations $dG_1$ and $dG_2$ in the values of the coordinates $G_1$ and $G_2$ are defined by $-Im\{S_{11}\}$ and $Re\{S_{11}\}$ respectively, the above-mentioned requirements for approaching the matching point can be satisfied.

According to one embodiment of the present invention, based on the above facts, elements $dG_1$ and $dG_2$ of the displacement vector dG can be defined as expressed in Equation 7 (however, Equation 7 below is just one example of a method of defining the displacement vector, and according to another embodiment, this definition of the displacement vector can be variously modified based on types of a matching system and kinds of selected analytic coordinate system).

$$\begin{pmatrix} dG_1 \\ dG_2 \end{pmatrix} = \begin{pmatrix} -Q_2 \\ Q_1 \end{pmatrix} = \begin{pmatrix} -Im\{S_{11}\} \\ Re\{S_{11}\} \end{pmatrix} \quad \text{[Equation 7]}$$

Figure 4:
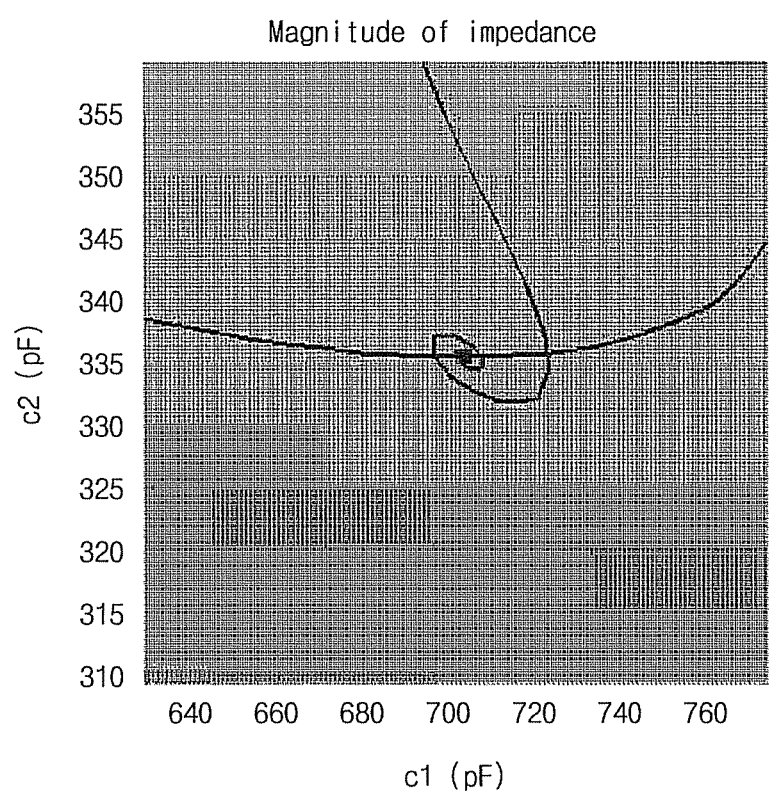
FIG. 4 is a diagram for illustrating instability around a matching point according to typical impedance matching.
Figure 5:
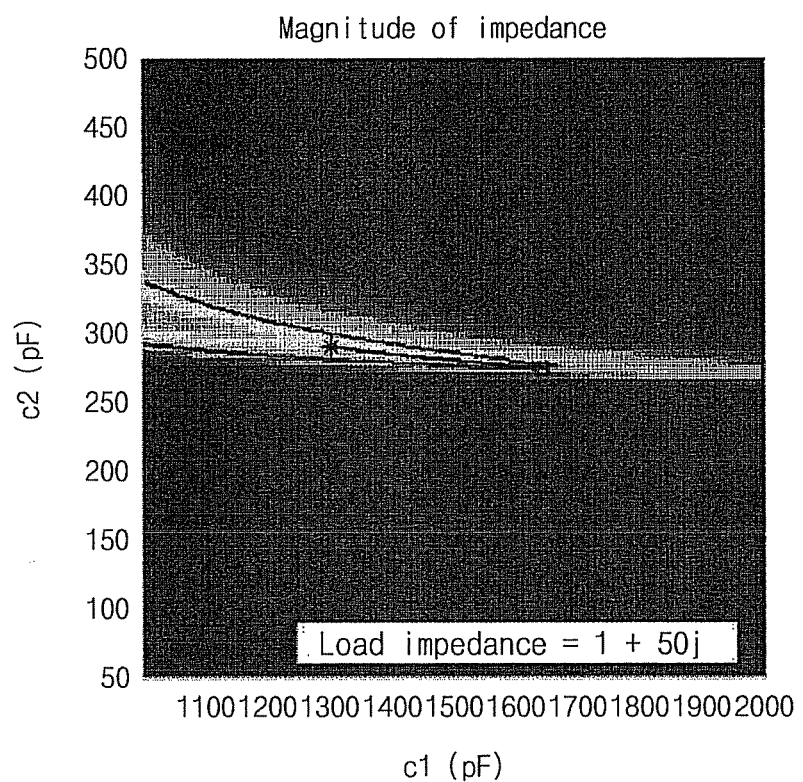
FIG. 5 is a diagram for illustrating high dependency on load impedance in typical impedance matching according to a typical method.
Figure 6:
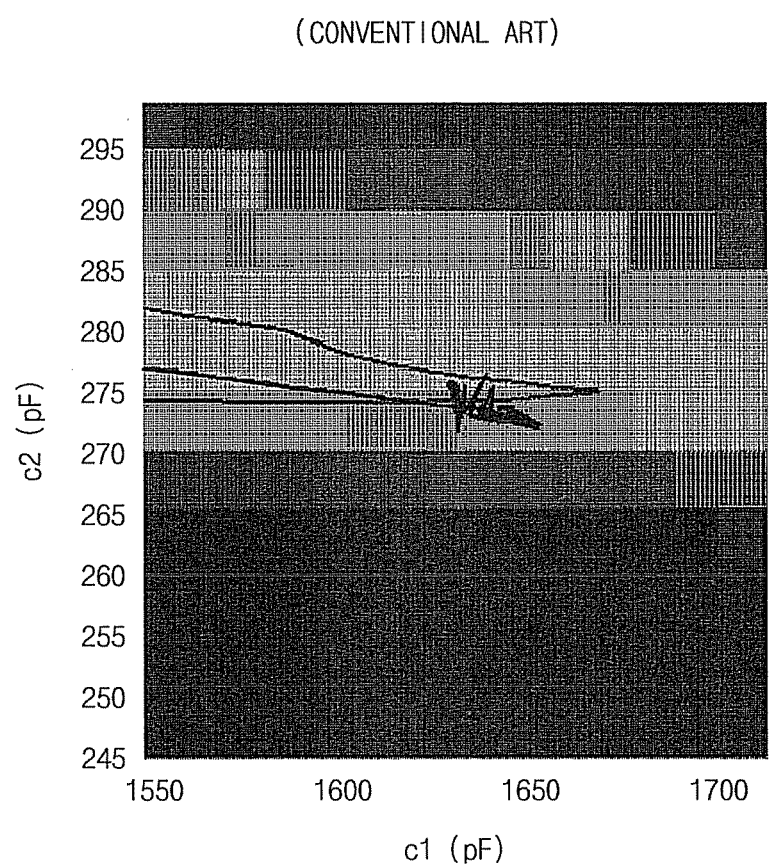
FIG. 6 is a diagram for illustrating haunting issue when a matching trajectory moves abnormally around a matching point according to a typical method.

According to Equation 1, as it approaches the matching point, the size of a reflection coefficient of the power transmission line approaches to 0. At this point, because elements of the displacement vector dG and the elements of the reflection coefficient $S_{11}$ have a quantitative relationship obtained by Equation 7, the matching method of this embodiment can search a trajectory that converges into the matching point at high speed. That is, according to the present invention, as the distance between the position of the measured characteristic vector and the matching point increases, the reflection coefficient increases. Therefore, the magnitude of the displacement vector dG also increases. This allows the matching trajectory to approach fast toward the matching point. Additionally, when the position of the measured characteristic vector is around the matching point, the reflection coefficient is small, and thus, this allows the displacement vector dG to have a small magnitude. Furthermore, this allows a matching trajectory to be accurately controlled around the matching point. Accordingly, the matching time delay described through FIG. 4 and the haunting issue described through FIG. 6 can be prevented.

Figure 1:
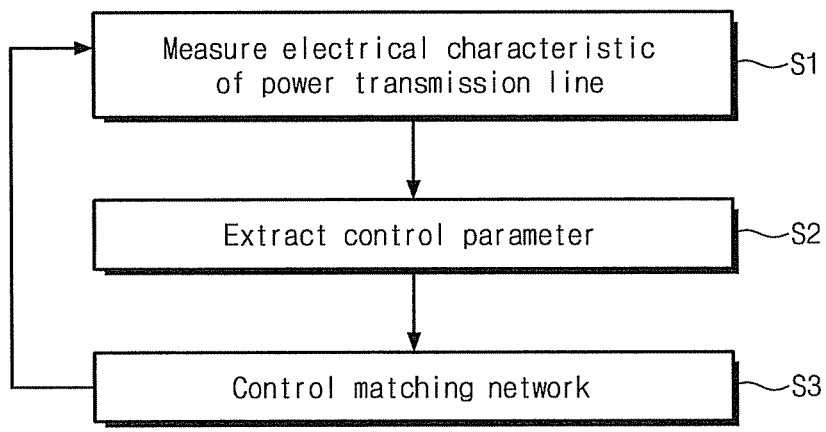
FIG. 1 is a flowchart for illustrating a typical impedance matching method.
Figure 2:
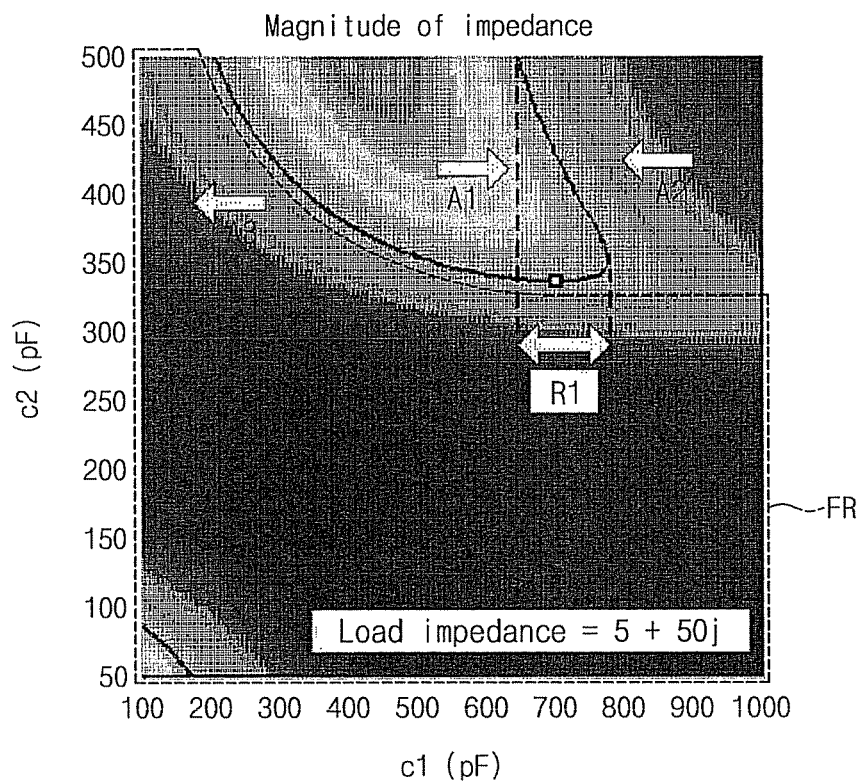
FIGS. 2 and 3 are diagrams of brute dependency on an initial state in typical impedance matching.
Figure 3:
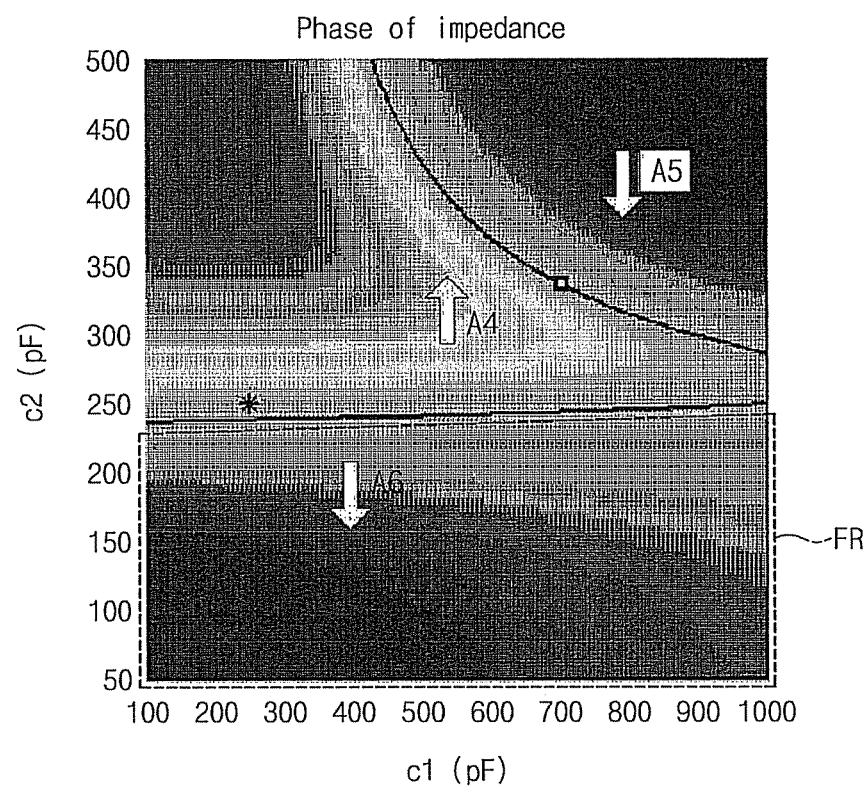

Moreover, as described above, because the coordinates $G_1$ and $G_2$ are converted to satisfy the requirements for injective mapping, ambiguity related to the selection of the coordinate movement direction according to the typical method described with reference to FIG. 2 is not shown in the present invention.

On the other hand, as described above, when the matching system is the inverted L-type including variable capacitors, differentiation of the coordinate $G_1$ may be a negative number of the imaginary part of the reflection coefficient, and differentiation of the coordinate $G_2$ may be a negative number of the real part of the reflection coefficient (i.e., $(dG_1;dG_2)=(-Q_2;-Q_1)=(Im\{S_{11}\};-Re\{S_{11}\}))$. Moreover, when the matching system is the T-type, the displacement vector may be identical to that of the inverted L-type, and when the matching system is the n-type, the displacement vector may be identical to that of the L-type.

[Determination of Control Parameter]

According to the present invention, the displacement vector dG is a physical quantity that converts reactance or admittance of the variable reactive element for analysis in the analytic coordinate system. Accordingly, to control the matching system, a process is required to convert the displacement vector into a magnitude (i.e., reactance of the variable reactive element) of an electrical characteristic of elements constituting the matching system, or a physical quantity related thereto. The converting of the displacement vector dG into the control parameters in operations S33 corresponds to the above converting process.

For this end, according to one embodiment of the present invention, the operation S33 may include inverse transforming the displacement vector dG into a reduced device vector dX' having a dimension of a variable physical quantity of the variable reactive element in operation S331, and converting the reduced device vector dX' into a driving vector V controlling the driving of the variable reactive elements in operation S332.

When considering the analytic coordinates $G_1$ and $G_2$ obtained through the conversion matrix T of Equations 3 and 4, the reduced device vector dX' may be obtained through an inner product of the inverse matrix $T^{-1}$ of the conversion matrix and the displacement vector dG, as expressed in Equations 8 and 9 below.

$$dX' = T^{-1}dG \quad \text{[Equation 8]}$$

$$\begin{pmatrix} dX'_1 \\ dX'_2 \end{pmatrix} = T^{-1} \begin{pmatrix} dG_1 \\ dG_2 \end{pmatrix} \quad \text{[Equation 9]}$$

On the other hand, if the matching system is the L-type including a variable capacitor as a variable reactive element, the reduced device vector dX' can be expressed in Equation 10 below through Equation 5, and if the matching system is the inverted L-type, the reduced device vector dX' can be expressed as Equation 11 below through Equation 6.

$$dX'_i \sim -\frac{dC_i}{C_i^2} \quad \text{[Equation 10]}$$

$$dX'_i \sim dC_i \quad \text{[Equation 11]}$$

According to one embodiment of the present invention, reactance of the variable reactive element may be controlled by rotation of a predetermined driving motor. In this case, the driving vector V may have values for a numerical control of the driving motor as its elements, and its magnitude and physical dimension may vary according to kinds of the numerical control methods and the driving motors. For example, the driving vector V may be obtained by a scalar product of the reduced device vector dX' and a predetermined numerical control factor M as expressed in Equation 12.

$$\begin{pmatrix} V_1 \\ V_2 \end{pmatrix} = M \begin{pmatrix} dX'_1 \\ dX'_2 \end{pmatrix} \quad \text{[Equation 12]}$$

At this point, $V_1$ and $V_2$ represent inputted control parameters in order to drive the driving motors that are respectively connected to the first and second variable capacitors. Additionally, the numerical control factor M may be a normalized size (e.g., a standard speed of an operating motor) of the numerical control, and the reduced device vector dX' is selected to have the same dimension as the driving vector V.

On the other hand, by the definition of Equations 5 and 6, the reduced device vector dX' has a dimension of reactance or admittance. Accordingly, to actually control the variable reactive element, a process may be further required to convert the reduced device vector dX' into a primary physical quantity (e.g., capacitance or inductance). That is, when the matching system is the L-type, as expressed in Equation 10, because the reduced device vector dX' has a different dimension than the capacitance, the driving vector V converts the reduced device vector dX' into a capacitance dimension through Equation 10. In this case, the numerical control factor M can be expressed in a function of current capacitances $C_i$ of the variable capacitors through Equation 10. However, if the matching system is the inverted L-type, as given in Equation 11, because the reduced device vector dX' has the same dimension as the capacitance, the additional conversion process is not required.

On the other hand, according to the above Equation 7 and 9, Equation 12 also can be expressed as Equation 13 below. That is, according to this embodiment, variations (i.e., rotations of the driving motors connected to the first and second variable capacitors) of the first and second variable capacitors in the matching system are determined by the reflection coefficient (to be more specifically, the magnitude of a real part and an imaginary part of the reflection coefficient).

$$\begin{pmatrix} V_1 \\ V_2 \end{pmatrix} = MT^{-1} \begin{pmatrix} -\text{Im}\{S_{11}\} \\ \text{Re}\{S_{11}\} \end{pmatrix} \quad \text{[Equation 13]}$$

The controlling of the matching system in operation S40 includes adjusting reactance of variable reactive elements constituting the matching system by using the driving vector V.

According to a modified embodiment of the present invention, if at least one element of the driving vector V is greater than the maximum speed $V_{max}$ that can be driven in an actual driving motor, a rescale process can be further included in order to maintain a direction of a matching trajectory. In the rescale process, if one element of the driving vector V is greater than the maximum speed $V_{max}$, the element is set to the maximum speed $V_{max}$, and another element is reduced to a speed as illustrated below.

TABLE 1

|  | V1 | V2 |
|---|---|---|
| $V_1 > V_{max}$ | $V_1 = V_{max}$ | $V_2 = V_{max} \times (V_2/V_1)$ |
| $V_2 > V_{max}$ | $V_1 = V_{max} \times (V_1/V_2)$ | $V_2 = V_{max}$ |

[Matching State Test]

Figure 19:
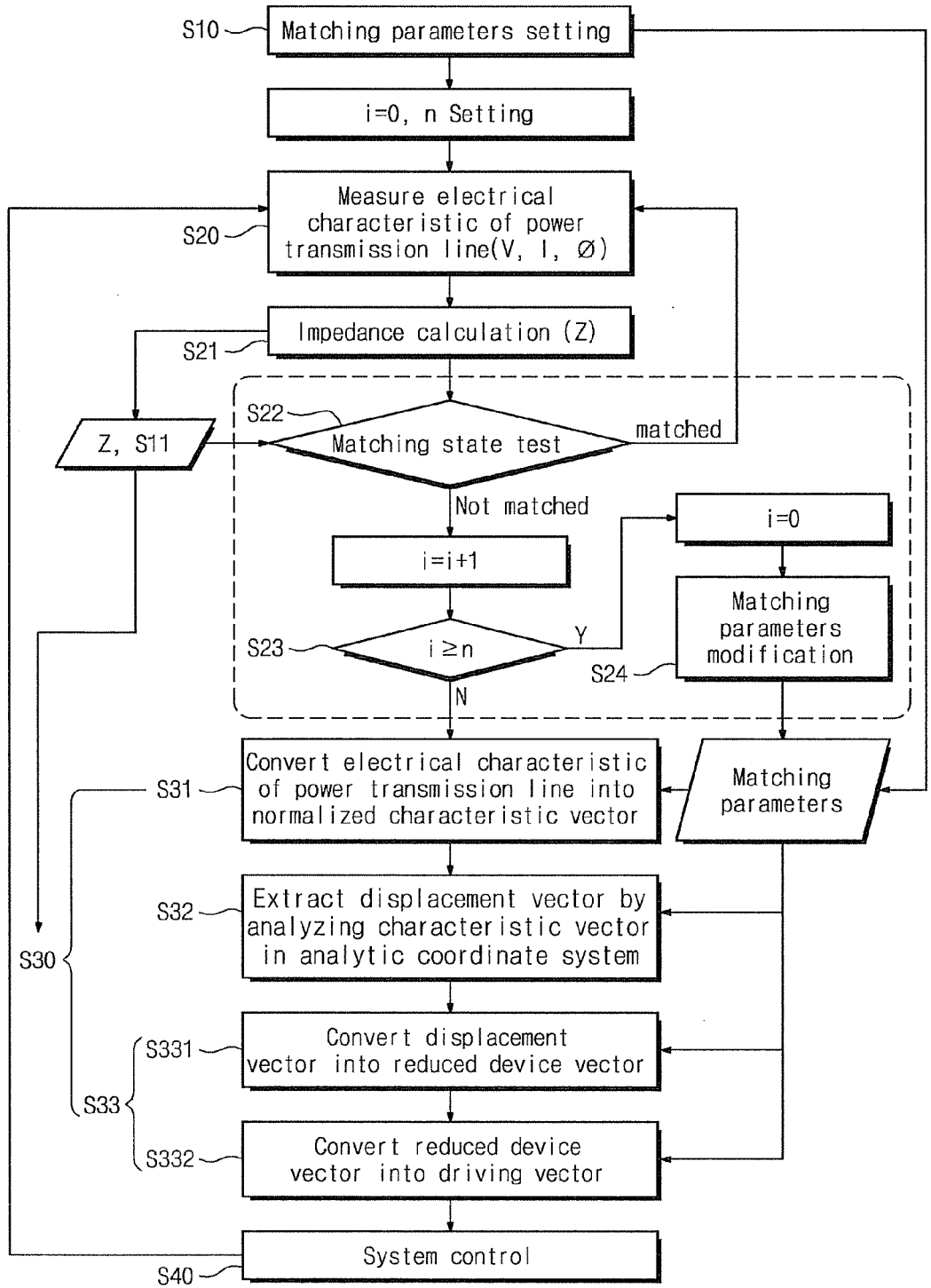
FIG. 19 is a flowchart of a matching method according to a modified embodiment of the present invention.
Figure 20:
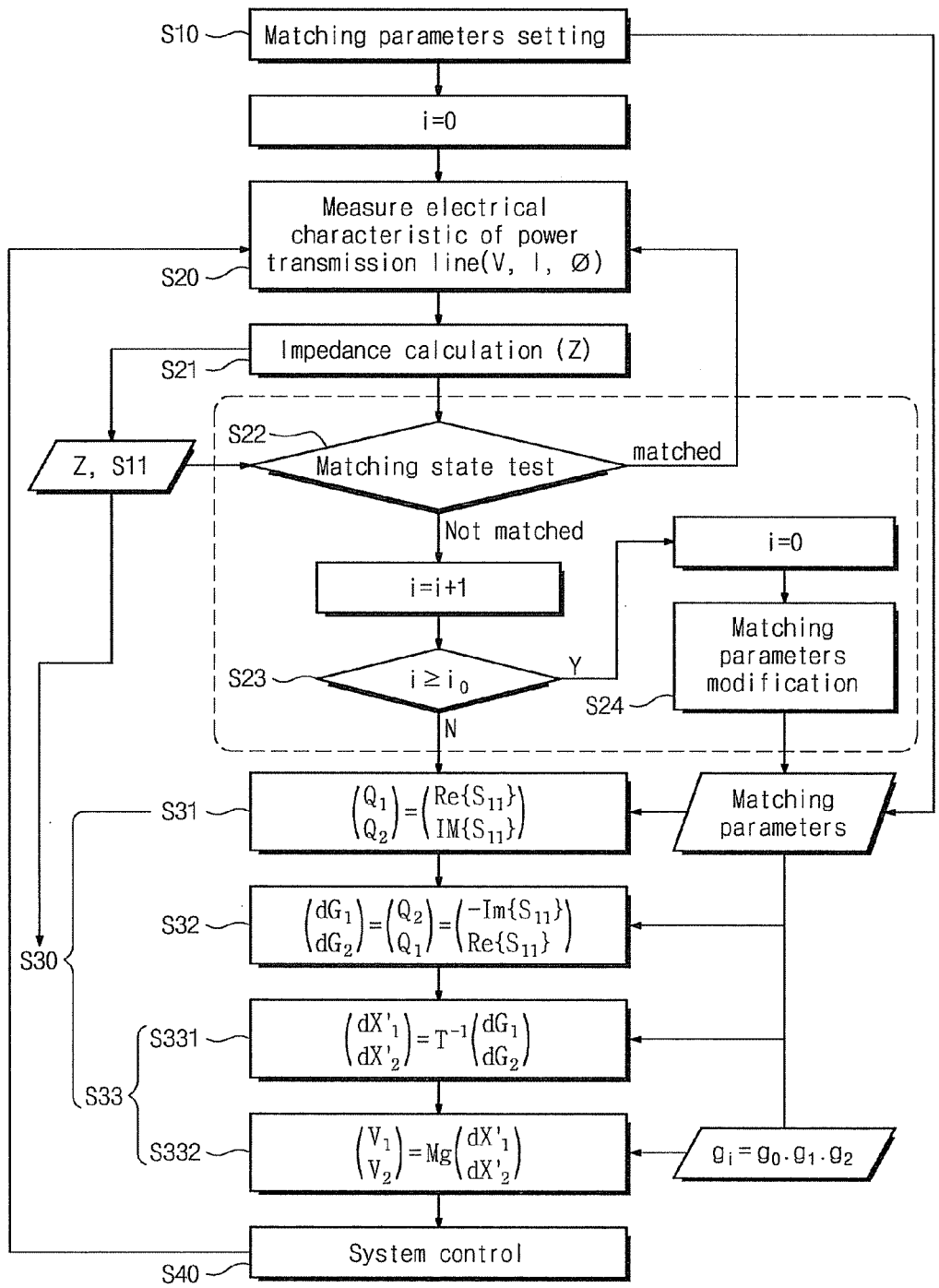
FIG. 20 is a flowchart of a detailed matching method according to a modified embodiment of the present invention.

FIGS. 19 and 20 are flowcharts of a matching method according to a modified embodiment of the present invention. This embodiment further includes performing a matching state test that determines whether the matching system is within an allowable matching state or not in operation S22 after the measuring of the electrical characteristic in operation S20. Except for the performing of the matching state test in operation S22, this embodiment is identical to the above-mentioned embodiments. Therefore, its overlapping description will be omitted for conciseness.

Referring to FIGS. 19 and 20, after the measuring of the electrical characteristic in operation S20, the matching state test that determines whether the matching system is within an allowable matching state or not is further performed in operation S22. In this operation S22, if the matching system is out of the allowable matching state, the extracting of the control parameters in operation S30 and the controlling of the matching system in operation S40 are performed as illustrated in the method of the above embodiment. Moreover, in this operation S22, if the matching system is within the allowable matching state, the electrical characteristic of the power transmission line is measured without the extracting of the control parameters in operation S30 and the controlling of the matching system in operation S40. Due to this matching state test in operation S22, the matching system reaching a matching state is not disturbed unnecessarily.

On the other hand, according to one embodiment of the present invention, this embodiment may further include evaluating whether setting values of the matching parameters are appropriate or not in operation S23, and modifying a portion of the matching parameters if the evaluation result is negative in operation S24. The evaluating of the setting values in operation S23 may include determining whether one period process from the measuring of the electrical characteristic of the power transmission line in operation S10 to the controlling of the system in operation S40 is repeated or not in the predetermined number of times n. The modifying of the matching parameters in operation S24 is performed when the electric device 100 does not reach a matching state even if the one period process is repeated in the predetermined number of times n. The kinds of modified matching parameter and modifying methods during the modifying of the matching parameter in operation S24 will be described in more detail below.

[Matching State Parameter]

On the other hand, according to the present invention, the performing of the matching test in operation S22 may be accomplished using a state parameter P (or, standing-wave ratio (SWR)) defined by Equation 14 below.

$$P = \frac{1+S}{1-S} \quad \text{[Equation 14]}$$

where S represents the magnitude (i.e., an absolute value) of a reflection coefficient $S_{11}$ of the power transmission line.

Figure 21:
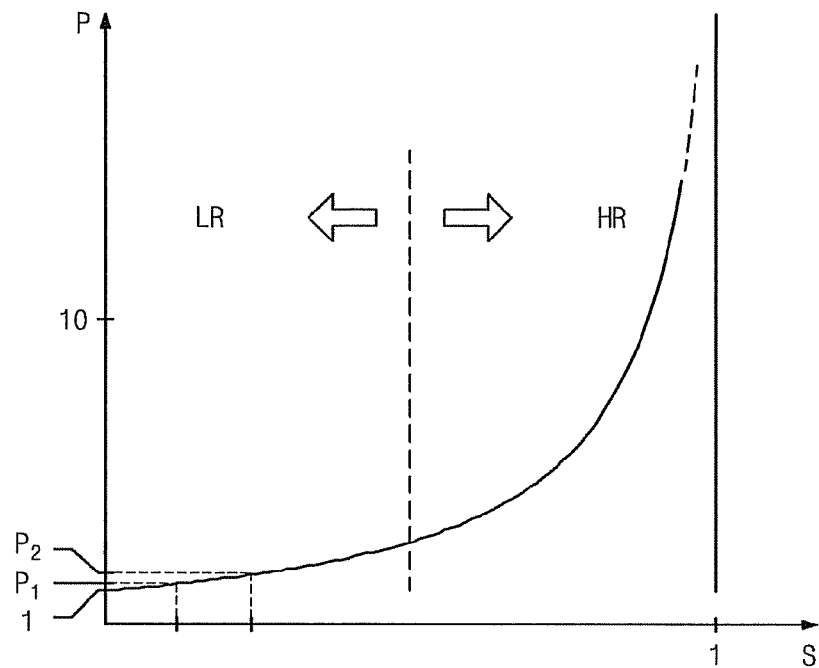
FIGS. 21 and 22 are diagrams of a matching state test method according to one embodiment of the present invention.

According to this definition, when the state parameter P is matched (i.e., S=0), it has a unit value 1, and when the state parameter P is extremely mismatched (i.e., S=1), it has an infinite value. Furthermore, as illustrated in FIG. 21, a changing rate of the state parameter P is small in a region LR close to the matching state, and is drastically increased in a region HR far from the matching state. That is, if the matching state is determined based on the state parameter defined by Equation 14 rather than the impedance itself, the matching state around a matching point can be more precisely determined.

Figure 22:
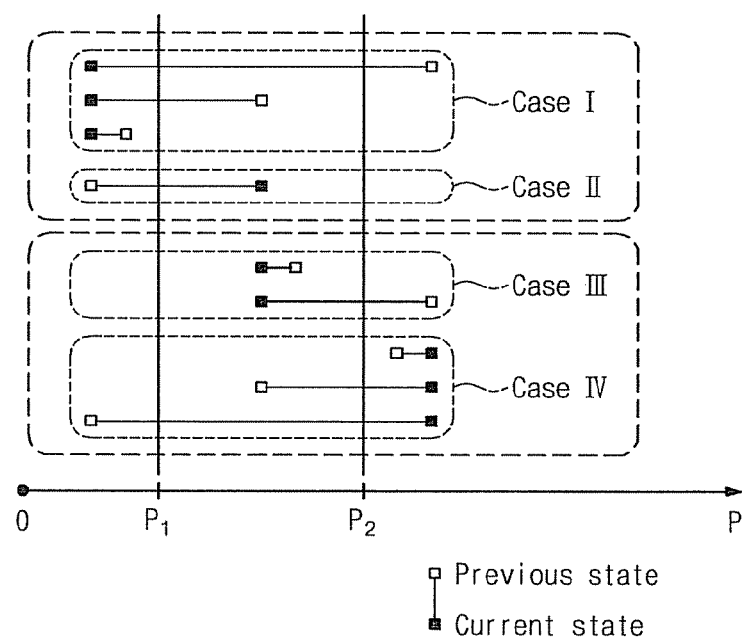

According to one embodiment of the present invention, the performing of the matching state test in operation S22 may include comparing a state parameter P_ of the previous operation (hereinafter, referred to as a prior parameter) and a current state parameter $P_0$ (hereinafter, referred to as a current parameter) with the minimum allowable value $P_1$ (hereinafter, referred to as the minimum level) of the sate parameter and the maximum allowable value $P_2$ (hereinafter, referred to as the maximum level) of the state parameter. To be more specific, referring to Table 2 and FIG. 22, if the current parameter $P_0$ is less than the minimum level $P_1$ (i.e., a case I), it is determined as a matching state regardless of the prior parameter P_. Additionally, if the current parameter $P_0$ is between the minimum level $P_1$ and the maximum level $P_2$, and the prior parameter P_ is less than the minimum level $P_1$ (i.e., a case II), it is determined as a matching state. If the current parameter $P_0$ is between the minimum level $P_1$ and the maximum level $P_2$, and the prior parameter P_ is more than the minimum level $P_1$ (i.e., a case III), it is determined as a mismatching state. Additionally, to make the entire system be a matching state, the extracting of the control parameter in operation S30 and the controlling of the matching system in operation S40 are performed. Furthermore, if the current parameter $P_0$ is greater than the maximum level $P_2$ (i.e., a case IV), it is determined as a mismatching state regardless of the prior parameter P_, to make the electric device 100 be in a matching state, the extracting of the control parameter in operation S30 and the controlling of the matching system in operation S40 are performed.

TABLE 2

| | Current state | Prior State | Matching Determination |
|---|---|---|---|
| Case I | $P_0 = P_1$ | | Yes |
| Case II | $P_1 < P_0 < P_2$ | $P_- = P_1$ | Yes |
| Case III | $P_1 < P_0 < P_2$ | $P_- > P_1$ | No |
| Case IV | $P_0 = P_2$ | | No |

| | |
|---|---|
| $P_0$ | Current state parameter |
| $P_-$ | Previous state parameter |
| $P_1$ | Allowable minimum value in state parameter |
| $P_2$ | Allowable maximum value in state parameter |

As illustrated above, if the matching state test is performed based on the minimum allowable value $P_1$ and the maximum allowable value $P_2$ of the state parameter, unnecessary matching state change can be minimized, such that accurate and effective matching characteristics can be obtained.

[Rotation Matrix]

According to one embodiment of the present invention, the characteristic vector Q, as expressed in Equation 15, can be selected by physical quantity that is obtained through rotating a real part $\text{Re}\{S_{11}\}$ and an imaginary part $(\text{Im}\{S_{11}\})$ of the reflection coefficient by a predetermined rotation matrix R.

$$\begin{pmatrix} Q_1 \\ Q_2 \end{pmatrix} = R(\theta) \begin{pmatrix} \text{Re}\{S_{11}\} \\ \text{Im}\{S_{11}\} \end{pmatrix} = \begin{pmatrix} \cos\theta & -\sin\theta \\ \sin\theta & \cos\theta \end{pmatrix} \begin{pmatrix} \text{Re}\{S_{11}\} \\ \text{Im}\{S_{11}\} \end{pmatrix} \quad \text{[Equation 15]}$$

At this point, an angle θ of the rotation matrix R may be a value between −90° and 90°. According to one embodiment of the present invention, the angle θ of the rotation matrix R may be set as 0° during the setting of the matching parameter of operation S10. On the other hand, if the electric device 100 does not reach the matching state within the predetermined number of times by the performing of the matching state based on the first selected angle, the angle θ of the rotation matrix R may be changed into one value between −90° and 90° during the changing of the matching parameter in operation S24. An angle change of the rotation matrix R provides an effect of elongation of the power transmission line. An angle change of the rotation matrix R does not change an absolute value of the reflection coefficient, but only its phase value. Accordingly, the angle change of the rotation matrix R is one method of changing a matching parameter, which can be selected in order to prevent matching failure, and change matching trajectory.

[Gain Factor]

According to one embodiment of the present invention, the driving vector V can be obtained by a scalar product of the numerical control factor M, the reduced device vector dX′, and a gain factor g, as illustrated in Equation 16. At this point, the gain factor g may be a product of a standard gain factor $g_0$ and a first gain factor $g_1$ as defined in Equation 17.

$$V = M \cdot g \cdot dg' \quad \text{[Equation 16]}$$

$$g = g_0 \cdot g_1$$

The standard gain factor $g_o$ may be a constant that is a standard size of the gain factor g. Additionally, the first gain factor $g_1$ is set to allow the magnitude of the driving vector V to have a dynamic correlation with respect to the measured characteristic vector. That is, the first gain factor $g_1$ is a variable that depends on the measured characteristic vector, and is defined to have a larger value as the magnitude (i.e., the magnitude of the displacement vector) of coordinate movement in the analytic coordinate system, which is required for matching, is larger. According to one embodiment of the present invention, the first gain factor $g_1$ is given as expressed in Equation 18 below.

$$g_1 = g_{min} + [g_{max} - g_{min}] \frac{S^m}{S_0^m + S^m} \quad \text{[Equation 18]}$$

At this point, S represents the magnitude of the reflection coefficient. Additionally, $g_{max}$, $g_{min}$, $S_0$, and m are matching parameters determined by considering environmental factors such as physical/electrical characteristics of the matching system, and as described above, can be changed during the modifying of the matching parameter of operation S24. To be more specific, $g_{max}$ and $g_{min}$ represent the maximum value and the minimum value of the first gain factor, respectively. $S_o$ represents the standard value of the first gain factor. Additionally, m is a characteristic parameter determining the value of the first gain factor, and also can be modified by a user or a computer during the modifying of the matching parameter of operation S24. Furthermore, the above Equation 1 is just one example of methods of defining the first gain factor $g_1$ and also can be defined through various other methods.

Figure 23:
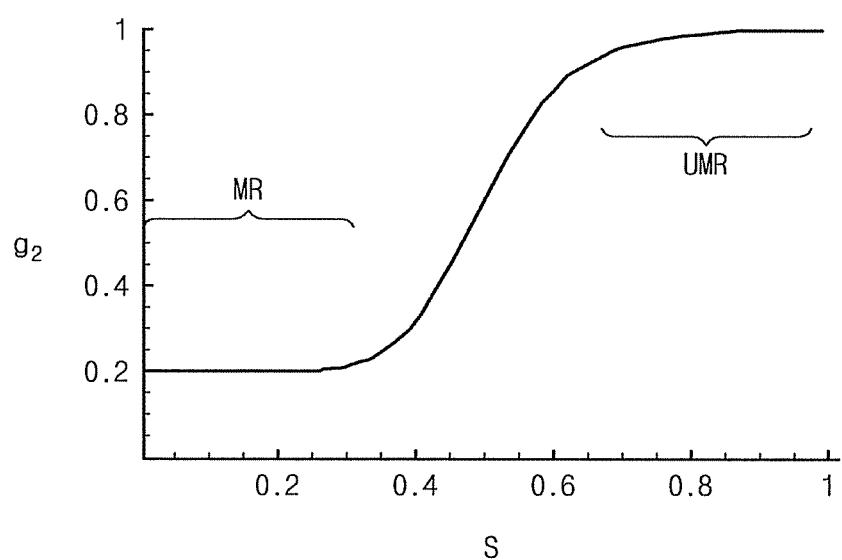
FIG. 23 is a graph of a gain factor according one embodiment of the present invention.

FIG. 23 is a graph for illustrating a relationship between a gain factor (esp. the first gain factor $g_1$) and the magnitude S of the reflection coefficient according to one embodiment of the present invention. According to this embodiment, the first gain factor $g_1$ is defined by Equation 18, and in this case, $g_{max}$, $g_{min}$, and $S_o$ are given with 1, 0.2, and 0.5, respectively.

Referring to FIG. 23, the first gain factor $g_1$ has a value close to $g_{min}$ in a region MR where the magnitude S of the reflection coefficient is small, and has a value close to $g_{max}$ in a region UMR where the magnitude S of the reflection coefficient is large. A level (i.e., a matching level) in which the electric device 100 is close to the matching state is inversely proportional to the magnitude S of the reflection coefficient. Accordingly, referring to Equations 16 and 18, the first gain factor $g_1$ defined as FIG. 23 is contributed to increase the magnitude of the driving vector V when the matching level is low, and also is contributed to decrease the magnitude of the driving vector V when the matching level is high. That is, the first gain factor $g_1$ can accurately controls a matching trajectory when the matching level is high (i.e., around a matching point), and moves a matching trajectory toward around the matching point within a short time when the matching level is low. These effects due to the first gain factor $g_1$ are contributed to more enhance technical effects obtained by the displacement vector, defined by Equation 7.

On the other hand, according to another embodiment of the present invention, a gain factor g, as defined by Equation 19 below, is a product of a standard gain factor $g_0$ and a second gain factor $g_2$, or is a product of the standard gain factor $g_0$, the first gain factor $g_1$, and the second gain factor $g_2$, as defined by Equation 20 below.

$$g = g_0 \cdot g_2 \quad \text{[Equation 19]}$$

$$g = g_0 \cdot g_1 \cdot g_2 \quad \text{[Equation 20]}$$

The second gain factor $g_2$ may be defined to prevent matching failure in a situation where change of a matching trajectory is required. For example, when reactance or admittance in at least one of the variable reactive elements reaches a feasible extreme value, the matching trajectory needs to be changed to prevent a matching failure. The second gain factor $g_2$ can be defined to cause a change of this matching trajectory. According to one embodiment of the present invention, a normal case where a change of the matching trajectory is unnecessary is set as 1, and an abnormal case where a change of the matching trajectory is necessary is set as −1.

$$g_2 = +1 \text{(normal)}$$

$$g_2 = -1 \text{(abnormal)} \quad \text{[Equation 21]}$$

On the other hand, after changing the matching trajectory by a certain degree defined by a predetermined condition, the second gain factor $g_2$ may be set with +1 again in order to perform a normal matching process. At this point, requirements for restoring the second gain factor $g_2$ may be diversely defined if necessary. For example, after performing the matching process under the conditions where the second gain factor $g_2$ is defined as −1 within the predetermined number times, the above-mentioned normal matching process can be performed under the conditions where the second gain factor $g_2$ is defined as +1.

Figure 24:
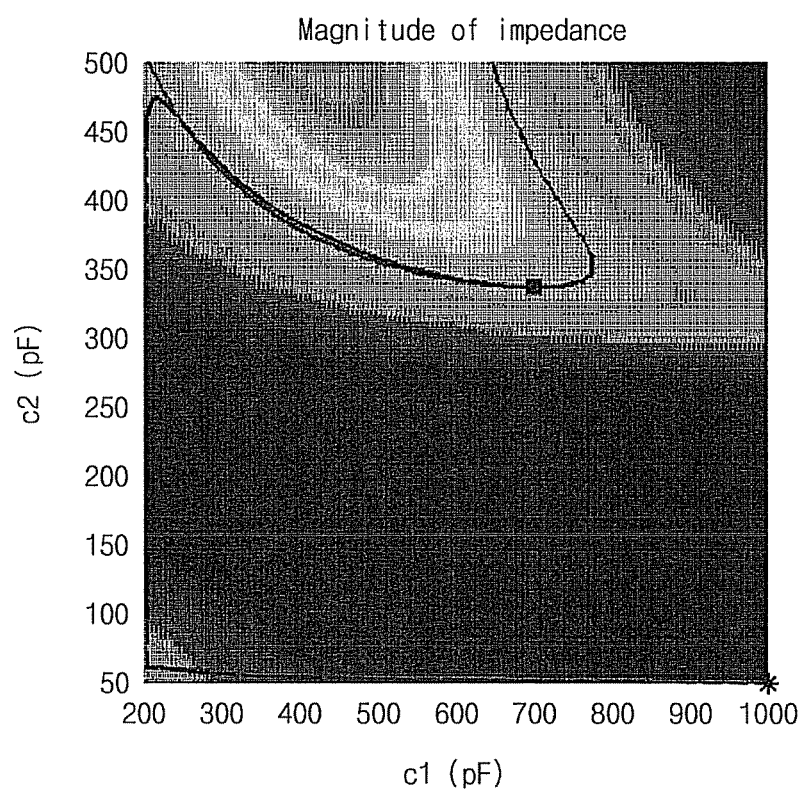
FIGS. 24 through 26 are diagrams of impedance matching results according to embodiments of the present invention.
Figure 25:
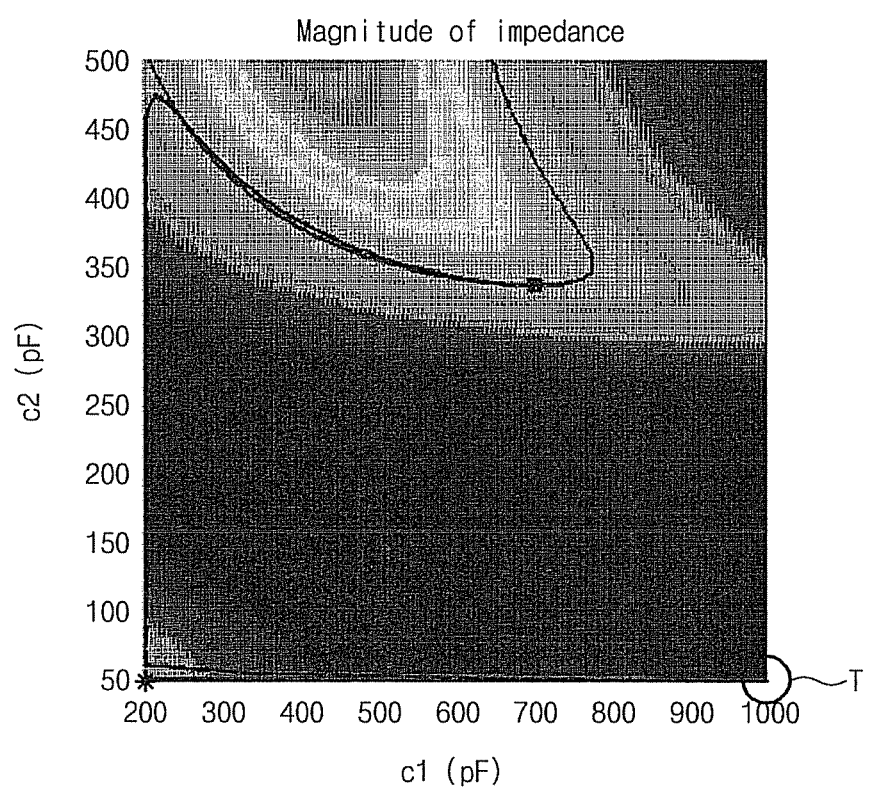

FIGS. 24 and 25 are diagrams illustrate results of impedance matching according to embodiments of the present invention. As described above, impedance matching according to theses embodiments is performed through the analytic coordinate system. However, in order to compare this method to the typical method, an impedance matching trajectory according to this embodiment is illustrated in a capacitance space of FIGS. 24 and 25 like FIG. 2.

Referring to FIGS. 24 and 25, initial states (referring to asterisks at the right lower portion of FIG. 24 and the left lower portion of FIG. 25) in these embodiments correspond to the cases where two variable capacitors have feasible extreme values. When starting with these initial states, the matching system cannot reach the matching state according to the typical methods. However, even with a extreme initial condition, as illustrated in FIGS. 24 and 25, the matching method of the present invention can allow the matching system to be within the matching point. That is, the matching method according to the present invention has less dependency on an initial state.

Especially, as illustrated in FIG. 25, the matching method of the present invention changes a direction of the matching trajectory at a turning point T in the right lower portion in order to reach the matching state even if a missed matching path is selected first. A change (esp. a change of the second gain factor $g_2$) of the above-mentioned parameter is contributed to change a direction of this matching trajectory.

Figure 26:
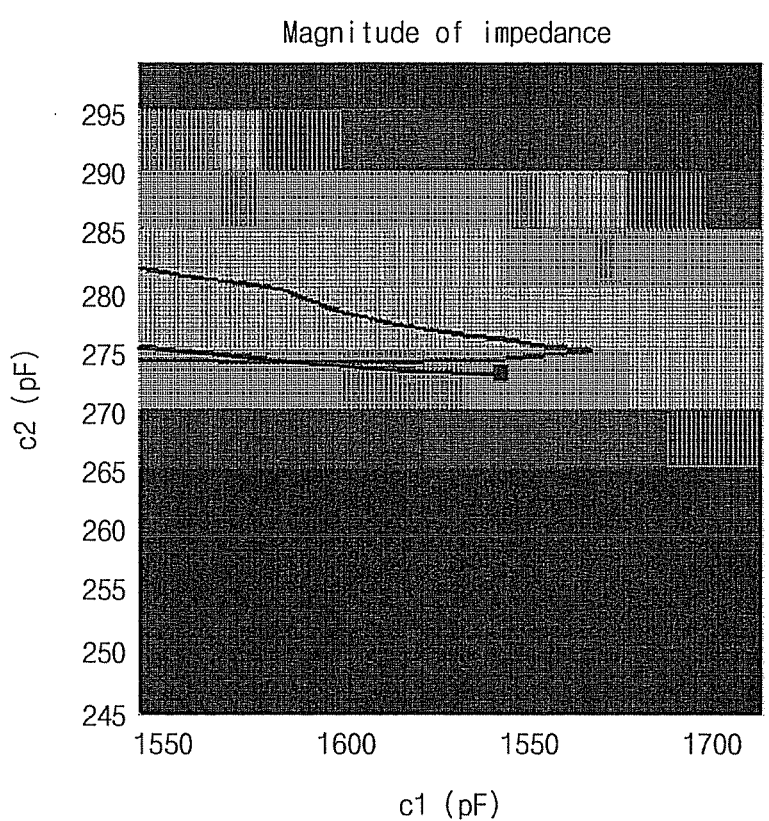

FIG. 26 is a diagram for illustrating a result of impedance matching according to one embodiment of the present invention.

Referring to FIG. 26, the matching method of the present invention creates a matching trajectory that stably reaches a matching point from around a matching point without a spiral matching trajectory or hunting of the typical method. That is, the matching method of the present invention provides improved matching convergence and enhanced matching characteristic around the matching point.

[Matching System]

Figure 27:
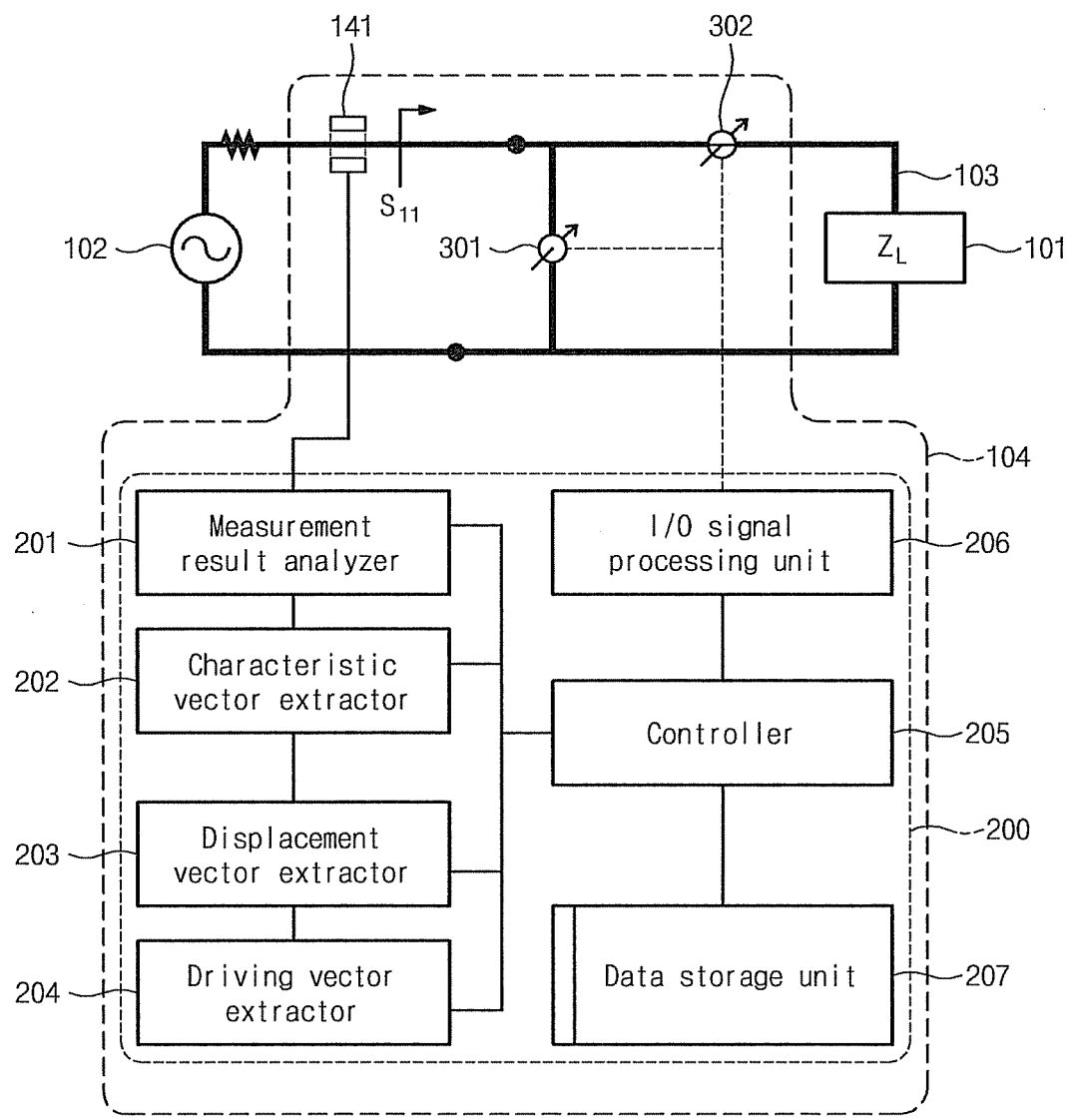
FIG. 27 is a view of a matching system according to the present invention.

FIG. 27 is a view of a matching system according to the present invention. In more detail, FIG. 27 is provided to further describe the matching system of the electric device 100 referring to FIG. 7.

Referring to FIGS. 7 and 27, the matching system 104 of the present invention includes a processing unit 200 performing each matching operation, and variable reactive elements 301 and 302. The matching system 104 may further include a sensor 141 measuring an electrical characteristic of the power transmission line 103.

The variable reactive elements 301 and 302 may variably control reactance of the electrical device 100 in order to match impedance of the electric device 100. For example, a variable capacitor or a variable inductor may be used as the variable reactive elements 301 and 302. Additionally, as described above, the matching system 104 may further include passive elements providing a fixed reactance besides the variable reactive elements 301 and 302. According to one embodiment of the present invention, the matching system 104 may be an L-type (described referring to FIG. 8) that uses the variable capacitors as the variable reactive elements.

In a functional aspect, the processing unit 200 includes a measurement result analyzer 201, a characteristic vector extractor 202, a displacement vector extractor 203, and a driving vector extractor 204. In a form aspect, the processing unit 200 may include one chip or one electronic board performing functions of the functional parts 201, 202, 203, and 204. According to another embodiment of the present invention, in a form aspect, the processing unit 200 may be a computer installed with software performing functions of the functional parts 201, 202, 203, and 204.

The measurement result analyzer 201 is configured to analyze an electrical characteristic of the power transmission line 103 measured in the sensor 141 in order to create output information, which is used as input information of the characteristic vector extractor 202. The output information of the measurement result analyzer 201 may be a complex impedance and a complex reflection coefficient of the power transmission line 103. The electrical characteristic of the power transmission line 103 measured in the sensor 141 may be a current, a voltage, and a phase difference of the power transmission line 103.

The characteristic vector extractor 202 is configured to process the converting of the measured electrical characteristic of the power transmission line into the normalized characteristic vector Q of operation S31, which is described referring to FIGS. 16, 19, and 20. For this end, the output infatuation of the measurement result analyzer 201 is used as the input information of the characteristic vector extractor 202. Moreover, the characteristic vector Q includes at least two independent physical quantities related to the electrical characteristic of the power transmission line and having a normalized magnitude as its elements. According to one embodiment of the present invention, the characteristic vector Q, as illustrated in the above [Selection of Characteristic Vector] and also expressed in Equation 2, can be defined as a two-dimensional vector including a real part $\text{Re}\{S_{11}\}$ and an imaginary part ($\text{Im}\{S_{11}\}$) of the reflection coefficient as its elements.

The displacement vector extractor 203, as described referring to FIGS. 16, 19, and 20, is configured to process the extracting of the displacement vector dG by analyzing the characteristic vector Q in the analytic coordinate system in operation S32. For this end, the output information of the characteristic vector extractor 202 is used as the input information of the displacement vector extractor 203. According to one embodiment of the present invention, the displacement vector dG, as described in the above [Determination of Displacement Vector] and expressed in Equation 7, can be defined as a two-dimensional vector including an imaginary part ($-\text{Im}\{S_{11}\}$) and a real part $\text{Re}\{S_{11}\}$ of the reflection coefficient as its elements. On the other hand, comparing to Equation 2 and Equation 7, the characteristic vector Q and the displacement vector dG are the same except for reverse of the element positions and change of sign. Therefore, characteristic vector Q and the displacement vector dG can be obtained by substantially the same process and the same processing unit in a matching system performing the above matching process.

The driving vector extractor 204 is configured to process the converting of the displacement vector dG into the reduced device vector dX' in operation S331, and the converting of the reduced device vector dX' into the driving vector V in operation S332, which are described with reference to FIGS. 19 and 20.

The converting of the displacement vector dG into the reduced device vector dX' in operation S331 includes converting the displacement vector dG through a predetermined matrix (i.e., an inverse matrix $T^{-1}$ of the conversion matrix) as expressed in Equations 8 and 9. At this point, the conversion matrix T provides a phase space dealing with the characteristic vector Q in the predetermined analytic coordinate system, and also can be prepared according to the method described in the above [Selection of Analytic coordinate system]. That is, the analytic coordinate system is selected to express a predetermined phase space that quantitatively relates the electrical characteristic of the matching system to the electrical characteristic of the power transmission line. For this end, the coordinates of the analytic coordinate system are selected from physical quantities related to the electrical characteristic of the matching system, and the electrical characteristic of the power transmission line is expressed as one point in the selected coordinates of the analytic coordinate system. According to one embodiment of the present invention, the coordinates of the analytic coordinate system (hereinafter, referred to as an analytic coordinates) can be expressed in a function of reactance or admittance of variable reactive elements constituting the matching system, and the characteristic vector Q can be expressed as one point in a reactance space or an admittance space, which is prepared using the same process above. The analytic coordinate system is selected to injectively map a quantitative relationship between the electrical characteristic of the matching system and the electrical characteristic of the power transmission line.

The converting of the reduced device vector dX' into the driving vector V in operation S332 can be obtained by a scalar product of the numerical control factor M and the reduced device vector dX', or a scalar product of a control factor M, the reduced device vector dX', and the gain factor g as expressed in Equation 12 or 16. At this point, the gain factor g may be a value that is defined in Equations 17, 19, and 20.

The processing unit 200 further includes a controller 205, an I/O signal processing unit 206, and a data storage unit 207. The I/O signal processing unit 206 is configured to process a numerical control signal for controlling the variable reactive elements 301 and 302. For example, the I/O signal processing unit 206 may include one of typical various I/O interfaces (including a series interface such as RS232C or a parallel interface such as centronics interface). The numerical control signal includes the driving vector V itself or information generated by the driving vector V. The data storage 207 temporarily stores matching parameters used in a series of procedures for generating the numerical control signal or information generated during the procedures. For this end, the data storage 207 may be a memory semiconductor chip such as flash memory or a hard disk. The controller 205 is configured to control the measurement result analyzer 201, the characteristic vector extractor 204, the I/O signal processing unit 206, and the data storage 207. Besides that, the controller 205 may be configured to control information exchange between them and operations of the variable reactive elements 301 and 302.

Furthermore, the processing unit 200 may further include at least one auxiliary unit that is configured to process the performing of the matching state test in operations S22 and S23, and the modifying of the matching parameter in operation S24, which are described with reference to FIG. 19. In more detail, this auxiliary unit may be configured to process a calculating of a state parameter for the matching state test, evaluating of appropriateness of the matching parameter, changing of an angle of the rotation matrix, and changing of the gain factors.

The elements constituting the matching system 104 or the processing unit 200 are configured to realize one of the above-mentioned matching methods according to the present invention. However, this configuration is not limited to the embodiments described with reference to FIG. 27, and can be diversely modified.

[Plasma Chamber System]

As illustrated with reference to FIG. 7, the matching system 104 of the present invention may be used for impedance matching of the electric device 100 having one of a plasma system, a nuclear magnetic resonance system, a communication system, a high frequency induction heating device, and a power transmission line as the load 101. Below, according to one embodiment of the present invention, a plasma chamber device used in the manufacturing process of a semiconductor device among various applicable fields is described with reference to FIG. 28. However, the electric device including the matching system of the present invention is not limited to the above. That is, the matching system of the present invention can be used in all kinds of electric devices requiring impedance matching through the impedance matching method or its simple modifications.

Figure 28:
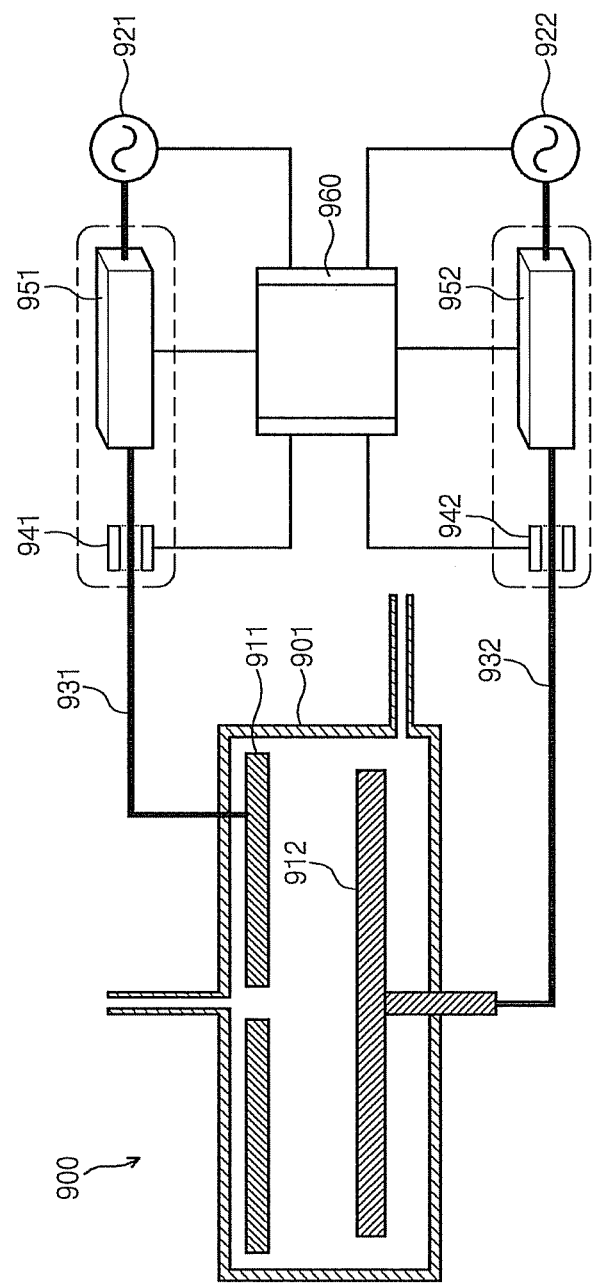
FIG. 28 is a view of a plasma chamber device including an impedance matching system according to one embodiment of the present invention.

FIG. 28 is a view of a plasma chamber device including an impedance matching system according to one embodiment of the present invention.

Referring to FIGS. 7 and 28, the plasma chamber device 900 of this embodiment includes a chamber 901 providing a space to which a semiconductor substrate is loaded, an upper electrode 911 and lower electrode 912 contributed to generate and control plasma in the chamber 901, and an upper power source 921 and a lower power source 922 providing powers to the upper and lower electrodes 911 and 912, respectively. An upper power transmission line 931 is disposed between the upper electrode 911 and upper power source 921 for connection therebetween, and a lower transmission line 932 is disposed between the lower electrodes 912 and the lower power source 922 for connection therebetween. An upper sensor 941 and a lower sensor 942 are respectively disposed on the upper and lower power transmission lines 931 and 932 to measure electrical characteristics of them. Furthermore, upper and lower matching systems 951 and 952 are disposed on the upper and lower power transmission lines 931 and 932, respectively, to maximize electric powers that are applied to the upper and lower electrodes 911 and 912. Furthermore, the plasma chamber device 900 further comprises a controller 960 for controlling the sensors, the matching systems, and the power sources.

At least one of the upper and lower matching systems 951 and 952 may be configured to realize one of the matching methods of the present invention. For example, the upper and lower matching systems 951 and 952 may be the matching system 104 including the processing unit 200 as illustrated with reference to FIG. 27.

According to one embodiment of the present invention, the control parameters are extracted to control the matching system through the analytic coordinate system that quantitatively relates the electrical characteristic of the matching system to the electrical characteristic of the power transmission line. At this point, the analytic coordinate system may be selected to injectively map a quantitative relationship between the electrical characteristic of the matching system and the electrical characteristic of the power transmission line. Because this use of the analytic coordinate system can remove ambiguity in the selection of the matching trajectory, impedance matching with stable and improved matching characteristics can be provided.

According to one embodiment of the present invention, to make the matching system be in a matching state, required reactance of the variable reactive elements is extracted based on the normalized magnitude of a physical quantity. Because the matching process is performed based on the normalized physical quantity, the matching process of the present invention can accurately control the matching trajectory around the matching point. Dependency on initial state and/or the system state of the matching characteristics and excessive dependency on a gain factor can be reduced.

According to one embodiment of the present invention, variation of reactance in the variable reactive elements is controlled based on the measured reflection coefficient (to be more specific, the magnitude of an imaginary part and a real part of the reflection coefficient) of the power transmission line. The imaginary part and the real part of the reflection coefficient have smaller values as it approaches toward a point where the matching trajectory is matched. Based on this fact, when determining the matching trajectory, fast and accurate matching can be accomplished.

The above-disclosed subject matter is to be considered illustrative, and not restrictive, and the appended claims are intended to cover all such modifications, enhancements, and other embodiments, which fall within the true spirit and scope of the present invention. Thus; to the maximum extent allowed by law, the scope of the present invention is to be determined by the broadest permissible interpretation of the following claims and their equivalents, and shall not be restricted or limited by the foregoing detailed description.

What is claimed is:

1. A matching method of an electric device including a load, a power transmission line, and a matching system, the method comprising:
  measuring an electrical characteristic of the power transmission line connected with the load through the matching system;
  extracting a control parameter for impedance matching from the electrical characteristic of the power transmission line; and
  controlling the matching system by using the control parameter,
  wherein the matching system comprises at least two variable reactive elements providing variable reactance, and a reactance variation of the variable reactive element depends on a matching degree of the matching system; and
  wherein controlling of the matching system comprises using a reflection coefficient as the matching degree of the matching system, the reflection coefficient being calculated from the measured electrical characteristic of the power transmission line.

2. The matching method of claim 1, wherein the controlling of the matching system comprises increasing the reactance variation of the variable reactive element as the reflection coefficient of the power transmission line increases.

3. The matching method of claim 1, wherein the variable reactive element comprises:
  at least one variable electrode providing a reactance change of the variable reactive element; and
  a driving device connected to the variable electrode to change a position of the variable electrode,
  wherein the controlling of the matching system comprises changing the position of the variable electrode by driving the driving device.

4. The matching method of claim 3, wherein the controlling of the matching system comprises increasing variation of the position of the variable electrode as the reflection coefficient of the power transmission line increases.

5. The matching method of claim 1, wherein the extracting of the control parameter comprises:
  calculating an input impedance of the power transmission line from the electrical characteristic of the power transmission line; and
  calculating the reflection coefficient of the power transmission line from the input impedance,
  wherein during the controlling of the matching system, a reactance variation of a first variable reactive element is proportional to a magnitude of an imaginary part in the reflection coefficient, and a reactance variation of a second variable reactive element is proportional to a magnitude of a real part in the reflection coefficient.

6. The matching method of claim 1, wherein the extracting of the control parameter comprises utilizing an analytic coordinate system that quantitatively relates the electrical characteristic of the matching system to the electrical characteristic of the power transmission line.

7. The matching method of claim 6, wherein the analytic coordinate system is selected to injectively map a quantitative relationship between the electrical characteristic of the matching system and the electrical characteristic of the power transmission line.

8. The matching method of claim 6, wherein the extracting of the control parameter comprises obtaining a displacement vector required for matching of the matching system by analyzing a position and a magnitude of a point corresponding to the measured electrical characteristic of the power transmission line in the analytic coordinate system.

9. The matching method of claim 1, wherein the extracting of the control parameter comprises:
calculating an input impedance of the power transmission line from the electrical characteristic of the power transmission line;
calculating the reflection coefficient of the power transmission line from the input impedance; and
obtaining a gain factor from the reflection coefficient of the power transmission line,
wherein a reactance variation of the variable reactive element is proportional to a product of the gain factor and the matching degree of the matching system.

10. The matching method of claim 9, wherein the obtaining of the gain factor comprises multiplying a predetermined standard gain by a first gain factor, the first gain factor having a larger value as the reflection coefficient of the power transmission line increases.

11. The matching method of claim 9, wherein the obtaining of the gain factor comprises multiplying a predetermined standard gain, a first gain factor, and a second gain factor, the first gain factor having a larger value as the reflection coefficient of the power transmission line increases, the second gain factor having 1 if a reactance variation of the variable reactive element is within an allowable characteristic range of the matching system, and having −1 if not.

12. The matching method of claim 1, further comprising performing a matching state test that confirms whether the matching system is within an allowable matching state or not before the extracting of the control parameter.

13. The matching method of claim 12, wherein the performing of the matching state test comprises:
calculating a state parameter from the electrical characteristic of the power transmission line;
evaluating whether the state parameter is within an allowable range or not; and
measuring again the electrical characteristic of the power transmission line if the state parameter is within the allowable range.

14. The matching method of claim 1, further comprising repeating a series of procedures that include the measuring of the electrical characteristic, the extracting of the control parameter, and the controlling of the matching system,
wherein the procedures are performed based on predetermined matching parameters for an extraction of the control parameter and a control of the matching system.

15. The matching method of claim 14, further comprising changing the matching parameter between the procedures,
wherein the changing of the matching parameter is selectively performed if the matching system does not reach a matching state at the more than critical number of times.

16. The matching method of claim 1, wherein the load is one of a plasma system, a nuclear magnetic resonance system, a communication system, a high frequency induction heating device, and a power transmission line.

17. A matching system performing the matching method of claim 1.

18. A matching method of an electric device including a load, a power transmission line, and a matching system, the method comprising:
measuring an electrical characteristic of the power transmission line connected with the load through the matching system;
converting the electrical characteristic of the power transmission line into a characteristic vector;
obtaining a displacement vector required for matching of the matching system by analyzing a magnitude of the characteristic vector in an analytic coordinate system;
converting the displacement vector into a control parameter for a control of the matching system; and
controlling the matching system by using the control parameter,
wherein the analytic coordinate system is selected to injectively map a quantitative relationship between the electrical characteristic of the matching system and an electrical characteristic of the power transmission line, and the characteristic vector is converted to have a normalized magnitude.

19. The matching method of claim 18, wherein coordinates of the analytic coordinate system are selected from physical quantities related to the electrical characteristic of the matching system, and
the extracting of the control parameter comprises obtaining a displacement vector required for matching of the matching system by analyzing a position and a magnitude of a point corresponding to the measured electrical characteristic of the power transmission line in the analytic coordinate system.

20. The matching method of claim 18, wherein the matching system comprises at least two variable reactive elements providing variable reactance,
coordinates of the analytic coordinate system are physical quantities obtained by converting the electrical characteristic of the variable reactive elements through a predetermined conversion matrix T,
the conversion matrix and the coordinates of the analytic coordinate system are selected according to a type of the matching system, and
the conversion matrix is prepared using at least one of an empirical data analysis, a theoretical approach analysis, and a computer simulation analysis.

21. The matching method of claim 20, wherein the matching system is one of an L-type, an inverted L-type, a T-type, and a π type,
wherein, if the matching system is the L-type including variable capacitors, the coordinates of the analytic coordinate system are selected by a physical quantity that is proportional to an inverse number of a capacitance of each of the variable capacitors, and if the matching system is the inverted L-type including variable capacitors, the coordinates of the analytic coordinate system are selected by a physical quantity that is proportional to a capacitance of each of the variable capacitors.

22. The matching method of claim 18, wherein the converting of the electrical characteristic of the power transmission line into the characteristic vector comprises:
- calculating input impedance of the power transmission line from the electrical characteristic of the power transmission line;
- calculating a reflection coefficient of the power transmission line from the input impedance; and
- calculating a characteristic vector from the reflection coefficient, the characteristic vector expressing the electrical characteristic of the power transmission line,
- wherein the characteristic vector is a second dimensional vector including a real part and an imaginary part of the reflection coefficient as its elements.

23. The matching method of claim 18, wherein the load is one of a plasma system, a nuclear magnetic resonance system, a communication system, a high frequency induction heating device, and a power transmission line.

24. A matching system performing the matching method of claim 18.

25. A matching method of an electric device including a load, a power transmission line, and a matching system, the method comprising:
- measuring an electrical characteristic of the power transmission line connected with the load through the matching system;
- extracting a control parameter from the electrical characteristic of the power transmission line; and
- controlling the matching system by using the control parameter,
- wherein the matching system comprises at least two variable reactive elements providing variable reactance,
- the extracting of the control parameter comprises calculating an imaginary part and a real part of the reflection coefficient of the power transmission line, and
- the controlling of the matching system comprises respectively controlling variations of reactance of the first and second variable reactive elements by using magnitudes of the imaginary part and the real part of the reflection coefficient.

26. The matching method of claim 25, wherein the controlling of the matching system comprises controlling the first and second variable reactive elements in order to allow reactance of the first and second variable reactive elements to have variations, the variations being proportional to values obtained by multiplying a gain factor and the respective imaginary part and the real part of the reflection coefficient.

27. The matching method of claim 25, wherein the load is one of a plasma system, a nuclear magnetic resonance system, a communication system, a high frequency induction heating device, and a power transmission line.

28. A matching system performing the matching method of claim 25.

29. A matching system comprising:
- a characteristic vector extractor expressing a measured electrical characteristic of a power transmission line as a characteristic vector having at least two normalized physical quantities;
- a reduced device vector extractor extracting a reduced device vector from the characteristic vector, the reduced device vector expressing a reactance variation required for impedance matching; and
- a driving vector extractor extracting a driving vector for driving a variable reactive element from the reduced device vector.

* * * * *